United States Patent
Lo et al.

(10) Patent No.: US 11,120,988 B2
(45) Date of Patent: Sep. 14, 2021

(54) SEMICONDUCTOR DEVICE PACKAGES AND METHODS OF MANUFACTURING THE SAME

(71) Applicant: Advanced Semiconductor Engineering, Inc., Kaohsiung (TW)

(72) Inventors: Pei-Jen Lo, Kaohsiung (TW); Cheng-Lung She, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 125 days.

(21) Appl. No.: 16/529,572

(22) Filed: Aug. 1, 2019

(65) Prior Publication Data
US 2021/0035794 A1   Feb. 4, 2021

(51) Int. Cl.
*H01L 23/58* (2006.01)
*H01L 21/02* (2006.01)

(52) U.S. Cl.
CPC ........ *H01L 21/0223* (2013.01); *H01L 23/585* (2013.01); *H01L 2224/02331* (2013.01); *H01L 2224/02373* (2013.01)

(58) Field of Classification Search
CPC ............. H01L 23/585; H01L 2224/023; H01L 2224/0231; H01L 2224/0233; H01L 2224/02331; H01L 2224/02373; H01L 2224/02381; H01L 2224/03019; H01L 2224/0312; H01L 2224/04105; H01L 24/03; H01L 24/05; H01L 25/0652; H01L 25/0657; H01L 25/071; H01L 25/112; H01L 25/117; H01L 25/16; H01L 25/18; H01L 25/50; H01L 25/074; H01L 25/105
See application file for complete search history.

(56) References Cited

U.S. PATENT DOCUMENTS

| | | | | |
|---|---|---|---|---|
| 2007/0232051 A1* | 10/2007 | Wang | ...................... | H01L 24/03 438/612 |
| 2011/0101521 A1* | 5/2011 | Hwang | ............... | H01L 23/5329 257/737 |
| 2011/0298101 A1* | 12/2011 | Pagaila | ............... | H01L 21/4871 257/659 |
| 2012/0153493 A1* | 6/2012 | Lee | .......................... | H01L 24/24 257/774 |
| 2019/0051622 A1 | 2/2019 | Chen et al. | | |
| 2019/0131277 A1 | 5/2019 | Yang et al. | | |

* cited by examiner

*Primary Examiner* — Robert G Bachner
*Assistant Examiner* — Molly K Reida
(74) *Attorney, Agent, or Firm* — Foley & Lardner LLP

(57) ABSTRACT

A semiconductor device package includes a first semiconductor device, a first redistribution layer (RDL) structure and a second RDL structure. The first semiconductor device has a first conductive terminal and a second conductive terminal. The first RDL structure covers the first conductive terminal. The second RDL structure covers the second conductive terminal and being separated from the first RDL structure.

16 Claims, 33 Drawing Sheets

SEMICONDUCTOR DEVICE PACKAGES AND METHODS OF MANUFACTURING THE SAME

BACKGROUND

1. Field of the Disclosure

The present disclosure relates to, amongst other things, semiconductor device packages and methods of manufacturing the same.

2. Description of Related Art

A semiconductor device package may include some semiconductor devices stacked to one another; however, oxidation may adversely affect performance of the semiconductor device package.

SUMMARY

According to some example embodiments of the instant disclosure, a semiconductor device package includes a first semiconductor device, a first redistribution layer (RDL) structure and a second RDL structure. The first semiconductor device has a first conductive terminal and a second conductive terminal. The first RDL structure covers the first conductive terminal. The second RDL structure covers the second conductive terminal and being separated from the first RDL structure.

According to some example embodiments of the instant disclosure, a semiconductor device package includes a first RDL structure, a first semiconductor device, a second semiconductor device, a third semiconductor device, a first interconnection structure and a first anti-oxidation structure. The first RDL structure has a first surface and a second surface opposite the first surface. The first semiconductor device is disposed on the first surface of the first RDL structure. The second semiconductor device is disposed on the first surface of the first RDL structure and adjacent to the first semiconductor device. The third semiconductor device is disposed on the first semiconductor device and the second semiconductor device, and is electrically connected to the first semiconductor device and the second semiconductor device. The first interconnection structure is disposed adjacent to a side of the first semiconductor device. The first anti-oxidation structure is disposed on the first interconnection structure.

According to some example embodiments of the instant disclosure, a method includes providing a wafer; forming a number of RDL structures separated from one another on the wafer; forming a number of conductive pillars on the number of RDL structures; and forming an anti-oxidation structure on some of the number of conductive pillars.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

DETAILED DESCRIPTION

Figure 1:
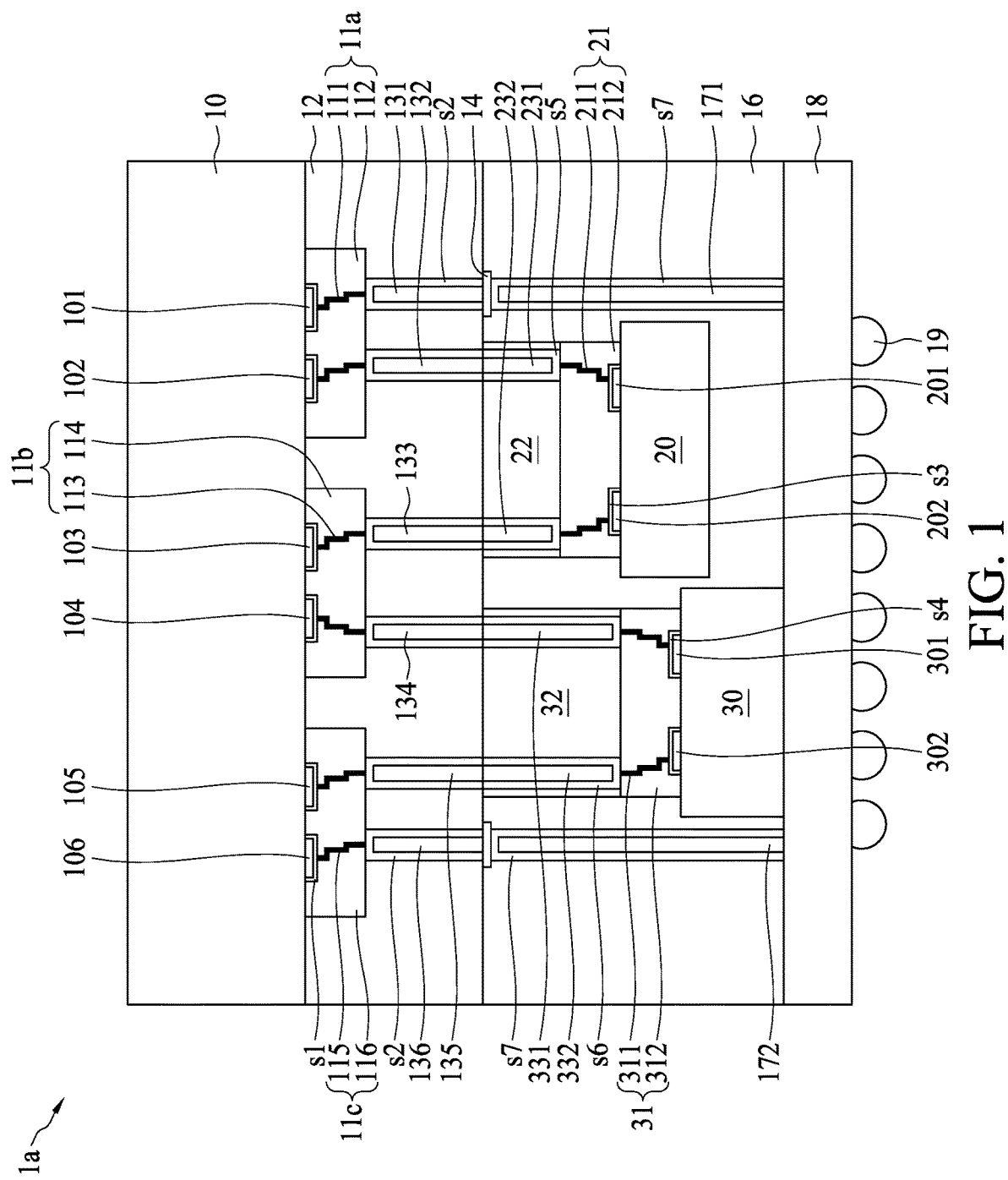
FIG. 1 is a cross-sectional view of a semiconductor device package in accordance with some embodiments of the present disclosure.

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

FIG. 1 is a cross-sectional view of a semiconductor device package in accordance with some embodiments of the present disclosure.

Referring to FIG. 1, the semiconductor device package 1a can include a semiconductor device 10, a redistribution layer (RDL) structure 11a, an RDL structure 11b, an RDL structure 11c, an insulation layer 12, an anti-oxidation structure 14, a semiconductor device 20, a semiconductor device 30, an insulation layer 16, an insulation layer 22, an insulation layer 32, an RDL structure 18, and connection elements 19.

The semiconductor device 10 can include, for example but is not limited to, a processor, a controller (e.g. a memory controller), a microcontroller (MCU), a logic die or other electronic component(s).

The semiconductor device 10 can include conductive terminals 101, 102, 103, 104, 105 and 106. Although six conductive terminals are illustrated in FIG. 1, however, it is contemplated that the semiconductor device 10 can include more or less conductive terminal(s) in accordance with some other embodiments of the subject application. The conductive terminal 101 may include, for example but is not limited to, aluminum (Al), copper (Cu), or other conductive material(s) (e.g. metal, alloy o non-metal conductive material(s)). Each of the conductive terminals 102, 103, 104, 105 and 106 may include material same or similar to the conductive terminal 101. Each of the conductive terminals 102, 103, 104, 105 and 106 may include material different from the conductive terminal 101. The semiconductor device 10 can include a circuitry electrically connected to conductive terminals 101, 102, 103, 104, 105 and 106.

The semiconductor device package 1a can include a conductive layer s1 disposed on the conductive terminal 101. The semiconductor device package 1a can include a conductive layer s1 disposed on the conductive terminal 102. The semiconductor device package 1a can include a conductive layer s1 disposed on the conductive terminal 103. The semiconductor device package 1a can include a conductive layer s1 disposed on the conductive terminal 104. The semiconductor device package 1a can include a conductive layer s1 disposed on the conductive terminal 105. The semiconductor device package 1a can include a conductive layer s1 disposed on the conductive terminal 106.

The conductive layer s1 can include a single-layer structure. The conductive layer s1 can include a multi-layer structure. The conductive layer s1 can function as a seed layer during manufacture of the semiconductor device package 1a (e.g. during electroplating operation). The conductive layer s1 can include, for example but is not limited to, titanium (Ti), copper (Cu), TiCu, or other conductive material(s).

Each of the conductive terminals 101, 102, 103, 104, 105 and 106 can include an upper surface (not denoted in FIG. 1), a lower surface (not denoted in FIG. 1) and a lateral surface (not denoted in FIG. 1) extended between the upper surface and the lower surface.

The conductive layer s1 can be disposed on the lower surface of the conductive terminal 101. The conductive layer s1 can be disposed on the lateral surface of the conductive terminal 101. The conductive layer s1 can be in direct contact with the lower surface of the conductive terminal 101. The conductive layer s1 can be in direct contact with the lateral surface of the conductive terminal 101.

The RDL structure 11a can include redistribution circuitry or wiring 111 and an insulation layer 112. The RDL structure 11a can include a single-layer structure. The RDL structure 11a can include a multi-layer structure. The RDL structure 11a can include a substrate. The RDL structure 11a can include a fan-out layer.

The redistribution circuitry 111 can include, for example but is not limited to, Cu or other suitable material(s). The redistribution circuitry 111 can include some conductive elements (not denoted in FIG. 1), for example but is not limited to, conductive trace(s), pad(s), contact(s), via(s). The redistribution circuitry 111 can be electrically connected to the conductive terminal 101. The redistribution circuitry 111 can be electrically connected to the conductive terminal 102.

The insulation layer 112 can include, for example but is not limited to, insulation material(s) or dielectric material(s). The insulation layer 112 can include flexible or relatively soft material.

The RDL structure 11b, which can include redistribution circuitry or wiring 113 and an insulation layer 114, can have a structure same or similar to the RDL structure 11a. The RDL structure 11b, which can include redistribution circuitry or wiring 113 and an insulation layer 114, can have a structure different from the RDL structure 11a. The redistribution circuitry 113 can be same or similar to the redistribution circuitry 111. The redistribution circuitry 113 can be different from the redistribution circuitry 111. The insulation layer 114 can be same or similar to the insulation layer 112. The insulation layer 114 can be different from the insulation layer 112. The redistribution circuitry 113 can be electrically connected to the conductive terminal 103. The redistribution circuitry 113 can be electrically connected to the conductive terminal 104.

The RDL structure 11c, which can include redistribution circuitry or wiring 115 and an insulation layer 116, can have a structure same or similar to the RDL structure 11a. The RDL structure 11c, which can include redistribution circuitry or wiring 115 and an insulation layer 116, can have a structure different from the RDL structure 11a. The redistribution circuitry 115 can be same or similar to the redistribution circuitry 111. The redistribution circuitry 115 can be different from the redistribution circuitry 111. The insulation layer 116 can be same or similar to the insulation layer 112. The insulation layer 116 can be different from the insulation layer 112. The redistribution circuitry 115 can be electrically connected to the conductive terminal 105. The redistribution circuitry 115 can be electrically connected to the conductive terminal 106.

The RDL structure 11a covers the conductive terminal 101. The RDL structure 11a covers the conductive terminal 102. The RDL structure 11a covers the conductive layer s1. The RDL structure 11a can be surrounded by the insulation layer 12.

The RDL structure 11b covers the conductive terminal 103. The RDL structure 11b covers the conductive terminal 104. The RDL structure 11b covers the conductive layer s1. The RDL structure 11b can be separated or spaced apart from the RDL structure 11a. The RDL structure 11b can be separated from the RDL structure 11a by a distance. The RDL structure 11b can be separated from the RDL structure 11a by the insulation layer 12. The RDL structure 11b can be surrounded by the insulation layer 12.

The RDL structure 11c covers the conductive terminal 105. The RDL structure 11c covers the conductive terminal 106. The RDL structure 11c covers the conductive layer s1. The RDL structure 11c can be separated or spaced apart from the RDL structure 11a. The RDL structure 11c can be separated or spaced apart from the RDL structure 11b. The RDL structure 11c can be separated from the RDL structure 11a by a distance. The RDL structure 11c can be separated from the RDL structure 11b by a distance. The RDL structure 11c can be separated from the RDL structure 11a by the insulation layer 12. The RDL structure 11c can be separated from the RDL structure 11b by the insulation layer 12. The RDL structure 11c can be surrounded by the insulation layer 12.

The semiconductor device package 1a can include an interconnection structure (which can include a conductive post or pillar 131 and a conductive layer s2) electrically connected to the RDL structure 11a.

The conductive pillar 131 can be surrounded by the conductive layer s2. The conductive pillar 131 can be covered by the conductive layer s2. The conductive layer s2 may be in direct contact with the redistribution circuitry 111.

The conductive pillar 131 can include material same or similar to the redistribution circuitry 111. The conductive pillar 131 can include material different from the redistribution circuitry 111.

The conductive layer s2 can include structure same or similar to the conductive layer s1. The conductive layer s2 can include structure different from the conductive layer s1.

The semiconductor device package 1a can include an interconnection structure (which can include a conductive post or pillar 132 and a conductive layer s2) electrically connected to the RDL structure 11a.

The conductive pillar 132 can be surrounded by the conductive layer s2. The conductive pillar 132 can be covered by the conductive layer s2. The conductive layer s2 may be in direct contact with the redistribution circuitry 111.

The conductive pillar 132 can include structure same or similar to the conductive pillar 131. The conductive pillar 132 can include structure different from the conductive pillar 131.

The semiconductor device package 1a can include an interconnection structure (which can include a conductive post or pillar 133 and a conductive layer s2) electrically connected to the RDL structure 11b.

The conductive pillar 133 can be surrounded by the conductive layer s2. The conductive pillar 133 can be covered by the conductive layer s2. The conductive layer s2 may be in direct contact with the redistribution circuitry 113.

The conductive pillar 133 can include structure same or similar to the conductive pillar 131. The conductive pillar 133 can include structure different from the conductive pillar 131.

The semiconductor device package 1a can include an interconnection structure (which can include a conductive post or pillar 134 and a conductive layer s2) electrically connected to the RDL structure 11b.

The conductive pillar 134 can be surrounded by the conductive layer s2. The conductive pillar 134 can be covered by the conductive layer s2. The conductive layer s2 may be in direct contact with the redistribution circuitry 113.

The conductive pillar 134 can include structure same or similar to the conductive pillar 131. The conductive pillar 134 can include structure different from the conductive pillar 131.

The semiconductor device package 1a can include an interconnection structure (which can include a conductive post or pillar 135 and a conductive layer s2) electrically connected to the RDL structure 11c.

The conductive pillar 135 can be surrounded by the conductive layer s2. The conductive pillar 135 can be covered by the conductive layer s2. The conductive layer s2 may be in direct contact with the redistribution circuitry 115.

The conductive pillar 135 can include structure same or similar to the conductive pillar 131. The conductive pillar 135 can include structure different from the conductive pillar 131.

The semiconductor device package 1a can include an interconnection structure (which can include a conductive post or pillar 136 and a conductive layer s2) electrically connected to the RDL structure 11c.

The conductive pillar 136 can be surrounded by the conductive layer s2. The conductive pillar 136 can be covered by the conductive layer s2. The conductive layer s2 may be in direct contact with the redistribution circuitry 115.

The conductive pillar 136 can include structure same or similar to the conductive pillar 131. The conductive pillar 136 can include structure different from the conductive pillar 131.

The insulation layer 12 can include material same or similar to the insulation layer 112. The insulation layer 12 can include material different from the insulation layer 112.

The insulation layer 12 can surround the redistribution structure 11a. The insulation layer 12 can surround the redistribution structure 11b. The insulation layer 12 can surround the redistribution structure 11c. The insulation layer 12 can surround the conductive layer s2. The insulation layer 12 can surround the conductive pillar 131. The insulation layer 12 can surround the conductive pillar 132. The insulation layer 12 can surround the conductive pillar 133. The insulation layer 12 can surround the conductive pillar 134. The insulation layer 12 can surround the conductive pillar 135. The insulation layer 12 can surround the conductive pillar 136.

The RDL structure 18 can have a structure same or similar to the RDL structure 11a. The RDL structure 18 can have a structure different from the RDL structure 11a. The RDL structure 18 can have an upper surface (not denoted in FIG. 1) and a lower surface (not denoted in FIG. 1) opposite the upper surface. The RDL structure 18 can be electrically connected to the interconnection structure which includes the conductive post or pillar 171 and the conductive layer s7. The RDL structure 18 can be electrically connected to the interconnection structure which includes the conductive post or pillar 172 and the conductive layer s7.

The connection elements 19 can be disposed on the lower surface of the RDL structure 18 for external connection, for example but is not limited to, to a system board (e.g. a printed circuit board (PCB)). The connection element 19 can include solder or other suitable material(s). The connection element 19 can be electrically connected to the interconnection structure which includes the conductive post or pillar 171 and the conductive layer s7. The connection element 19 can be electrically connected to the interconnection structure which includes the conductive post or pillar 172 and the conductive layer s7. The connection element 19 can be electrically connected to the RDL structure 18.

The connection elements 19 can be electrically connected to the semiconductor device 10 via a conductive path, which can include the RDL structure 18, the interconnection structure which include the conductive pillar 171 and the conductive layer s7, the anti-oxidation structure 14, the interconnection structure which include the conductive pillar 131 and the conductive layer s2, the redistribution circuitry 111, the conductive layer s1, and the conductive terminal 101. The conductive path as discussed here can provide relatively fast signal or data transmission between the connection elements 19 and the semiconductor device 10 (e.g. signal input/out (I/O)).

The connection elements 19 can be electrically connected to the semiconductor device 10 via a conductive path, which can include the RDL structure 18, the interconnection structure which include the conductive pillar 172 and the conductive layer s7, the anti-oxidation structure 14, the interconnection structure which include the conductive pillar 136 and the conductive layer s2, the redistribution circuitry 115, the conductive layer s1, and the conductive terminal 106. The conductive path as discussed here can provide relatively fast signal or data transmission between the connection elements 19 and the semiconductor device 10 (e.g. signal input/out (I/O)).

The semiconductor device package 1a can include an interconnection structure (which can include a conductive post or pillar 171 and a conductive layer s7) electrically connected to the RDL structure 18. The interconnection structure, which can include the conductive post or pillar 171 and the conductive layer s7), may be disposed on the RDL structure 18. The conductive post or pillar 171 can be in direct contact with the upper surface of the RDL structure 18. The conductive layer s7 can be in direct contact with the upper surface of the RDL structure 18.

The conductive pillar 171 can include structure same or similar to the conductive pillar 131. The conductive pillar 171 can include structure different from the conductive pillar 131.

The conductive layer s7 can include structure same or similar to the conductive layer s1. The conductive layer s7 can include structure different from the conductive layer s1.

The conductive pillar 171 can be surrounded by the conductive layer s7. The conductive pillar 171 can be surrounded by the insulation layer 16. The conductive layer s7 can cover the conductive pillar 171.

The interconnection structure, which can include a conductive post or pillar 171 and a conductive layer s7, can be electrically connected to the interconnection structure, which can include a conductive post or pillar 131 and a conductive layer s2.

The semiconductor device package 1a can include an interconnection structure (which can include a conductive post or pillar 172 and a conductive layer s7) electrically connected to the RDL structure 18. The interconnection structure, which can include the conductive post or pillar 172 and the conductive layer s7), may be disposed on the RDL structure 18. The conductive post or pillar 172 can be in direct contact with the upper surface of the RDL structure 18.

The conductive pillar 172 can include structure same or similar to the conductive pillar 171. The conductive pillar 172 can include structure different from the conductive pillar 171.

The conductive pillar 172 can be surrounded by the conductive layer s7. The conductive pillar 172 can be surrounded by the insulation layer 16. The conductive layer s7 can cover the conductive pillar 172.

The interconnection structure, which can include a conductive post or pillar 172 and a conductive layer s7, can be electrically connected to the interconnection structure, which can include a conductive post or pillar 136 and a conductive layer s2.

The anti-oxidation structure 14 can be disposed on the conductive layer s7. The anti-oxidation structure 14 can be in direct contact with the conductive layer s7. The anti-oxidation structure 14 can be in direct contact with the conductive layer s2. The anti-oxidation structure 14 can be in direct contact with the conductive pillar 131. The anti-oxidation structure 14 can be in direct contact with the conductive pillar 136. The anti-oxidation structure 14 can be in direct contact with the interconnection structure which includes the conductive post or pillar 171 and the conductive layer s7. The anti-oxidation structure 14 can be in direct contact with the interconnection structure which includes the conductive post or pillar 172 and the conductive layer s7. The anti-oxidation structure 14 can be in direct contact with the interconnection structure which includes the conductive post or pillar 131 and the conductive layer s2. The anti-oxidation structure 14 can be in direct contact with the interconnection structure which includes the conductive post or pillar 136 and the conductive layer s2.

The anti-oxidation structure 14 can be disposed between the conductive layer s7 and the conductive layer s2. The anti-oxidation structure 14 can be disposed between the conductive layer s7 and the conductive pillar 131. The anti-oxidation structure 14 can be disposed between the conductive layer s7 and the conductive pillar 136. The anti-oxidation structure 14 can be disposed between the conductive pillar 131 and the conductive pillar 171. The anti-oxidation structure 14 can be disposed between the conductive pillar 136 and the conductive pillar 172. The anti-oxidation structure 14 can be surrounded by the insulation layer 16.

The anti-oxidation structure 14 can be disposed between the interconnection structure which includes the conductive post or pillar 171 and the conductive layer s7 and the interconnection structure which includes the conductive post or pillar 131 and the conductive layer s2.

The anti-oxidation structure 14 can be disposed between the interconnection structure which includes the conductive post or pillar 172 and the conductive layer s7 and the interconnection structure which includes the conductive post or pillar 136 and the conductive layer s2.

The anti-oxidation structure 14 can include a single-layer structure. The anti-oxidation structure 14 can include a multi-layer structure. The anti-oxidation structure 14 can include, for example but is not limited to, nickel (Ni), platinum (Pt), gold (Au), palladium (Pd) or other suitable material(s). The anti-oxidation structure 14 can include conductive material(s). The anti-oxidation structure 14 can material(s) which can be resistant to corrosion or oxidation. The anti-oxidation structure 14 can anti-oxidation material (s).

The anti-oxidation structure 14 can have a width greater than the conductive layer s7. The anti-oxidation structure 14 can have a width greater than the conductive layer s2. The anti-oxidation structure 14 can have a width greater than the conductive pillar 131. The anti-oxidation structure 14 can have a width greater than the conductive pillar 136. The anti-oxidation structure 14 can have a width greater than the conductive pillar 171. The anti-oxidation structure 14 can have a width greater than the conductive pillar 172.

The anti-oxidation structure 14 can have a width greater than the interconnection structure which includes the conductive layer s7 and the conductive pillar 171. The anti-oxidation structure 14 can have a width greater than the interconnection structure which includes the conductive layer s7 and the conductive pillar 172.

The anti-oxidation structure 14 can have a width greater than the interconnection structure which includes the conductive layer s2 and the conductive pillar 131. The anti-oxidation structure 14 can have a width greater than the interconnection structure which includes the conductive layer s2 and the conductive pillar 136.

Although it is not illustrated, it is contemplated that the anti-oxidation structure 14 can have a width equal to the conductive layer s7 in accordance with some other embodiments of the subject application. Although it is not illustrated, it is contemplated that the anti-oxidation structure 14 can have a width equal to the interconnection structure which includes the conductive layer s7 and the conductive pillar 171 in accordance with some other embodiments of the subject application. Although it is not illustrated, it is contemplated that the anti-oxidation structure 14 can have a width equal to the interconnection structure which includes the conductive layer s7 and the conductive pillar 172 in accordance with some other embodiments of the subject application.

Although it is not illustrated, it is contemplated that the anti-oxidation structure 14 can have a width equal to the conductive layer s2 in accordance with some other embodiments of the subject application. Although it is not illustrated, it is contemplated that the anti-oxidation structure 14 can have a width equal to the interconnection structure which includes the conductive layer s2 and the conductive pillar 131 in accordance with some other embodiments of the subject application. Although it is not illustrated, it is contemplated that the anti-oxidation structure 14 can have a width equal to the interconnection structure which includes the conductive layer s2 and the conductive pillar 136 in accordance with some other embodiments of the subject application.

The semiconductor device 20 can include, for example but is not limited to, a memory die, an integrated passive device (IPD), a radio frequency (RF) switch die or other electronic component(s). The semiconductor device 20 can be disposed on the RDL structure 18.

The semiconductor device 20 can be same or similar to the semiconductor device 10. The semiconductor device 20 can be different from the semiconductor device 10. The semiconductor device 20 can have a width different from the semiconductor device 10. The semiconductor device 20 can have a width less than the semiconductor device 10.

The semiconductor device 20 can be electrically connected to the semiconductor device 10 via a conductive path, which can include the conductive terminal 201, the conductive layer s3, the redistribution circuitry 211, the interconnection structure which can include the conductive layer s5 and the conductive pillar 231, the interconnection structure which can include the conductive layer s2 and the conductive pillar 132, the redistribution circuitry 111, the conductive layer s1, and the conductive terminal 102. The semiconductor device 20 can be electrically connected to the semiconductor device 10 via a conductive path, which can include the conductive terminal 202, the conductive layer s3, the redistribution circuitry 211, the interconnection structure which can include the conductive layer s5 and the conductive pillar 232, the interconnection structure which can include the conductive layer s2 and the conductive pillar 133, the redistribution circuitry 113, the conductive layer s1, and the conductive terminal 103. The conductive path as discussed here can provide relatively fast signal or data transmission between the semiconductor device 10 and the semiconductor device 20.

The semiconductor device 20 can include conductive terminals 201 and 202. Although two conductive terminals are illustrated in FIG. 1, however, it is contemplated that the semiconductor device 20 can include more or less conductive terminal(s) in accordance with some other embodiments of the subject application. The conductive terminal 201 may include, for example but is not limited to, aluminum (Al), copper (Cu), or other conductive material(s) (e.g. metal, alloy o non-metal conductive material(s)). Each of the conductive terminals 201 and 202 may include material same or similar to the conductive terminal 101. Each of the conductive terminals 201 and 202 may include material different from the conductive terminal 101. The semiconductor device 20 can include a circuitry electrically connected to conductive terminals 201 and 202.

The semiconductor device package 1a can include a conductive layer s3 disposed on the conductive terminal 201. The semiconductor device package 1a can include a conductive layer s3 disposed on the conductive terminal 202.

The conductive layer s3 can be same or similar to the conductive layer s1. The conductive layer s3 can be different from the conductive layer s1.

Each of the conductive terminals 201 and 202 can include an upper surface (not denoted in FIG. 1), a lower surface (not denoted in FIG. 1) and a lateral surface (not denoted in FIG. 1) extended between the upper surface and the lower surface.

The conductive layer s3 can be disposed on the upper surface of the conductive terminal 201. The conductive layer s3 can be disposed on the lateral surface of the conductive terminal 201. The conductive layer s3 can be in direct contact with the upper surface of the conductive terminal 201. The conductive layer s3 can be in direct contact with the lateral surface of the conductive terminal 201.

The RDL structure 21 can include redistribution circuitry or wiring 211 and an insulation layer 212. The RDL structure 21 can be same or similar to the RDL structure 11a. The RDL structure 21 can be different from the RDL structure 11a.

The redistribution circuitry 211 can include, for example but is not limited to, Cu or other suitable material(s). The redistribution circuitry 211 can include some conductive elements (not denoted in FIG. 1), for example but is not limited to, conductive trace(s), pad(s), contact(s), via(s). The redistribution circuitry 211 can be electrically connected to the conductive terminal 201. The redistribution circuitry 211 can be electrically connected to the conductive terminal 202.

The insulation layer 212 can be same or similar to the insulation layer 112. The insulation layer 212 can be different from the insulation layer 112.

The RDL structure 21 covers the conductive terminal 201. The RDL structure 21 covers the conductive terminal 202. The RDL structure 21 covers the conductive layer s3. The RDL structure 21 can be surrounded by the insulation layer 16.

The semiconductor device package 1a can include an interconnection structure (which can include a conductive post or pillar 231 and a conductive layer s5) electrically connected to the RDL structure 21.

The conductive pillar 231 can be surrounded by the conductive layer s5. The conductive layer s5 may be in direct contact with the redistribution circuitry 211. The conductive layer s5 may be in direct contact with the conductive layer s2. The conductive pillar 231 may be in direct contact with the conductive pillar 132.

The conductive pillar 231 can include material same or similar to the conductive pillar 131. The conductive pillar 231 can include material different from the conductive pillar 131.

The conductive layer s5 can include structure same or similar to the conductive layer s2. The conductive layer s5 can include structure different from the conductive layer s2.

The semiconductor device package 1a can include an interconnection structure (which can include a conductive post or pillar 232 and a conductive layer s5) electrically connected to the RDL structure 21.

The conductive pillar 232 can be surrounded by the conductive layer s5. The conductive layer s5 may be in direct contact with the redistribution circuitry 211. The conductive layer s5 may be in direct contact with the conductive layer s2. The conductive pillar 232 may be in direct contact with the conductive pillar 133.

The conductive pillar 232 can include structure same or similar to the conductive pillar 231. The conductive pillar 232 can include structure different from the conductive pillar 231.

The insulation layer 22 can include material same or similar to the insulation layer 12. The insulation layer 22 can include material different from the insulation layer 12.

The insulation layer 22 can surround the conductive layer s5. The insulation layer 22 can surround the conductive pillar 231. The insulation layer 22 can surround the conductive pillar 232.

The semiconductor device 30 can include, for example but is not limited to, a memory die, an integrated passive device (IPD), a radio frequency (RF) switch die or other electronic component(s). The semiconductor device 30 can be disposed on the RDL structure 18.

The semiconductor device 30 can be same or similar to the semiconductor device 20. The semiconductor device 30 can be different from the semiconductor device 20. The semiconductor device 30 can have a width different from the semiconductor device 10. The semiconductor device 30 can have a width less than the semiconductor device 10. The semiconductor device 10 can have a width greater than a sum of a width of the semiconductor device 20 and a sum of a width of the semiconductor device 30.

The semiconductor device 30 can be electrically connected to the semiconductor device 10 via a conductive path, which can include the conductive terminal 301, the conductive layer s4, the redistribution circuitry 311, the interconnection structure which can include the conductive layer s6 and the conductive pillar 331, the interconnection structure which can include the conductive layer s2 and the conductive pillar 134, the redistribution circuitry 113, the conductive layer s1, and the conductive terminal 104. The semiconductor device 30 can be electrically connected to the semiconductor device 10 via a conductive path, which can include the conductive terminal 302, the conductive layer s4, the redistribution circuitry 311, the interconnection structure which can include the conductive layer s6 and the conductive pillar 332, the interconnection structure which can include the conductive layer s2 and the conductive pillar 135, the redistribution circuitry 115, the conductive layer s1, and the conductive terminal 105. The conductive path as discussed here can provide relatively fast signal or data transmission between the semiconductor device 10 and the semiconductor device 30.

The semiconductor device 30 can be disposed at an elevation different from the semiconductor device 20. The semiconductor device 20 can be disposed at an elevation greater than the semiconductor device 30. Although it is not illustrated, it is contemplated that the semiconductor device 30 can be disposed at an elevation the same to the semiconductor device 20 in accordance with some other embodiments of the subject application.

The semiconductor device 30 can include conductive terminals 301 and 302. Although two conductive terminals are illustrated in FIG. 1, however, it is contemplated that the semiconductor device 30 can include more or less conductive terminal(s) in accordance with some other embodiments of the subject application. The conductive terminal 301 may include, for example but is not limited to, aluminum (Al), copper (Cu), or other conductive material(s) (e.g. metal, alloy o non-metal conductive material(s)). Each of the conductive terminals 301 and 302 may include material same or similar to the conductive terminal 101. Each of the conductive terminals 301 and 302 may include material different from the conductive terminal 101. The semiconductor device 30 can include a circuitry electrically connected to conductive terminals 301 and 302.

The semiconductor device package 1a can include a conductive layer s4 disposed on the conductive terminal 301. The semiconductor device package 1a can include a conductive layer s4 disposed on the conductive terminal 302.

The conductive layer s4 can be same or similar to the conductive layer s1. The conductive layer s4 can be different from the conductive layer s1.

Each of the conductive terminals 301 and 302 can include an upper surface (not denoted in FIG. 1), a lower surface (not denoted in FIG. 1) and a lateral surface (not denoted in FIG. 1) extended between the upper surface and the lower surface.

The conductive layer s4 can be disposed on the upper surface of the conductive terminal 301. The conductive layer s4 can be disposed on the lateral surface of the conductive terminal 301. The conductive layer s4 can be in direct contact with the upper surface of the conductive terminal 301. The conductive layer s4 can be in direct contact with the lateral surface of the conductive terminal 301.

The RDL structure 31 can include redistribution circuitry or wiring 311 and an insulation layer 312. The RDL structure 31 can be same or similar to the RDL structure 21. The RDL structure 31 can be different from the RDL structure 21.

The redistribution circuitry 311 can include, for example but is not limited to, Cu or other suitable material(s). The redistribution circuitry 311 can include some conductive elements (not denoted in FIG. 1), for example but is not limited to, conductive trace(s), pad(s), contact(s), via(s). The redistribution circuitry 311 can be electrically connected to the conductive terminal 301. The redistribution circuitry 311 can be electrically connected to the conductive terminal 302.

The insulation layer 312 can be same or similar to the insulation layer 212. The insulation layer 312 can be different from the insulation layer 212.

The RDL structure 31 covers the conductive terminal 301. The RDL structure 31 covers the conductive terminal 302. The RDL structure 31 covers the conductive layer s4. The RDL structure 31 can be surrounded by the insulation layer 16.

The semiconductor device package 1a can include an interconnection structure (which can include a conductive post or pillar 331 and a conductive layer s6) electrically connected to the RDL structure 31.

The conductive pillar 331 can be surrounded by the conductive layer s6. The conductive layer s6 may be in direct contact with the redistribution circuitry 611. The conductive layer s6 may be in direct contact with the conductive layer s2. The conductive pillar 331 may be in direct contact with the conductive pillar 134.

The conductive pillar 331 can include material same or similar to the conductive pillar 131. The conductive pillar 331 can include material different from the conductive pillar 131.

The conductive layer s6 can include structure same or similar to the conductive layer s5. The conductive layer s6 can include structure different from the conductive layer s5.

The semiconductor device package 1a can include an interconnection structure (which can include a conductive post or pillar 332 and a conductive layer s6) electrically connected to the RDL structure 31.

The conductive pillar 332 can be surrounded by the conductive layer s6. The conductive layer s6 may be in direct contact with the redistribution circuitry 311. The conductive layer s6 may be in direct contact with the conductive layer s2. The conductive pillar 332 may be in direct contact with the conductive pillar 135.

The conductive pillar 332 can include structure same or similar to the conductive pillar 331. The conductive pillar 332 can include structure different from the conductive pillar 331.

The insulation layer 32 can include material same or similar to the insulation layer 22. The insulation layer 32 can include material different from the insulation layer 22.

The insulation layer 32 can surround the conductive layer s6. The insulation layer 32 can surround the conductive pillar 331. The insulation layer 32 can surround the conductive pillar 332.

The insulation layer 16 can include material same or similar to the insulation layer 12. The insulation layer 16 can include material different from the insulation layer 12.

The insulation layer 16 can surround the anti-oxidation structure 14. The insulation layer 16 can surround the conductive layer s7. The insulation layer 16 can surround the conductive pillar 171. The insulation layer 16 can surround the conductive pillar 172.

The insulation layer 16 can surround the semiconductor device 20. The insulation layer 16 can surround the RDL structure 21. The insulation layer 16 can surround the insulation layer 22.

The insulation layer 16 can surround the semiconductor device 30. The insulation layer 16 can surround the RDL structure 31. The insulation layer 16 can surround the insulation layer 32.

The semiconductor device 10 can be disposed on the semiconductor device 20. The semiconductor device 10 can be disposed on the semiconductor device 30. The semiconductor device 20 can be disposed adjacent to the semiconductor device 30.

The interconnection structure, which includes the conductive post or pillar 171 and the conductive layer s7, can be disposed to be adjacent to a side of the semiconductor device 20 (e.g. right side as shown in FIG. 1). The interconnection structure, which includes the conductive post or pillar 172 and the conductive layer s7, can be disposed to be adjacent to a side of the semiconductor device 30 (e.g. left side as shown in FIG. 1). Although it is not illustrated in FIG. 1, it is contemplated that one or more interconnection structure can be disposed between the semiconductor device 20 and the semiconductor device 30 in some other embodiments of the subject application.

The semiconductor device package 1a can provide a relatively fast internal conductive path (e.g. between the semiconductor device 10 and the semiconductor device 20, or between the semiconductor device 10 and the semiconductor device 30). The semiconductor device package 1a can provide a relatively fast external conductive path (e.g. between the semiconductor device 10 and the connection element 19). The semiconductor device package 1a can mitigate or avoid latency of signal transmission.

FIG. 1A, FIG. 1B, FIG. 1C, FIG. 1D, FIG. 1E, FIG. 1F, FIG. 1G, FIG. 1H, FIG. 1I, FIG. 1J, FIG. 1K, FIG. 1L, FIG. 1M and FIG. 1N illustrate various stages of a method for manufacturing a semiconductor device package accordance with some embodiments of the subject application.

Figure 1A:
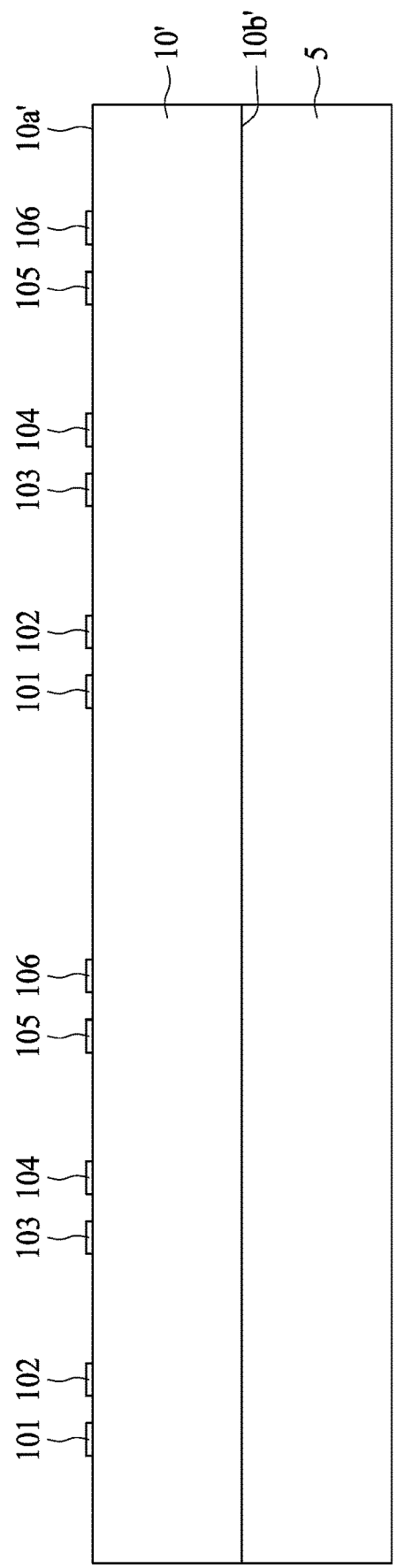
FIG. 1A, FIG. 1B, FIG. 1C, FIG. 1D, FIG. 1E, FIG. 1F, FIG. 1G, FIG. 1H, FIG. 1I, FIG. 1J, FIG. 1K, FIG. 1L, FIG. 1M and FIG. 1N illustrate various stages of a method for manufacturing a semiconductor device package accordance with some embodiments of the subject application.

Referring to FIG. 1A, a wafer 10' can be provided or disposed on a carrier 5. The wafer 10' can include some semiconductor devices (or dies) same or similar to the semiconductor device 10 as illustrated and described with reference to FIG. 1. Each of the semiconductor device can include conductive terminals 101, 102, 103, 104, 105 and 106.

The wafer 10' may have an upper surface 10a' and a lower surface 10b'. The conductive terminals 101, 102, 103, 104, 105 and 106 can be formed or disposed on the upper surface 10a' of the wafer 10'.

The lower surface 10b' of the wafer 10' can be bonded or attached to the carrier 5.

Figure 1B:
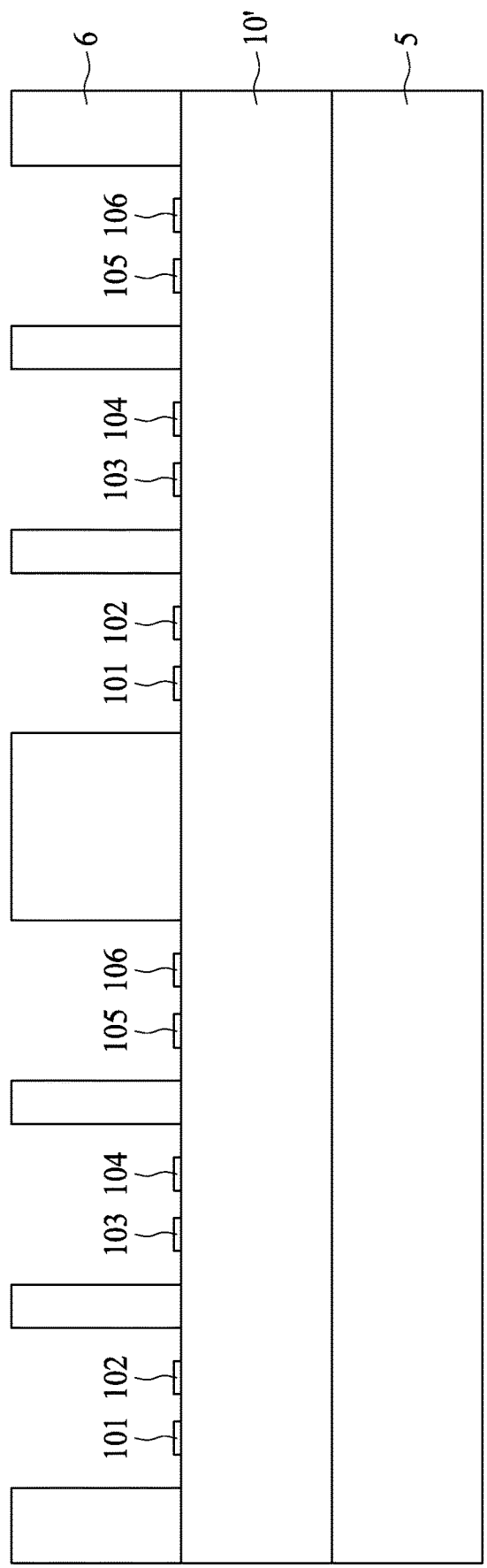

Referring to FIG. 1B, a patterned mask 6 can be formed on the wafer 10' to expose the conductive terminals 101, 102, 103, 104, 105 and 106.

The patterned mask (or photomask) 6 can include, for example but is not limited to, photoresist (PR) material or other suitable material(s). The patterned mask 6 can be formed by, for example but is not limited to, photolithography technique (which may involve coating, exposure, developing) or other suitable technique(s).

Figure 1C:
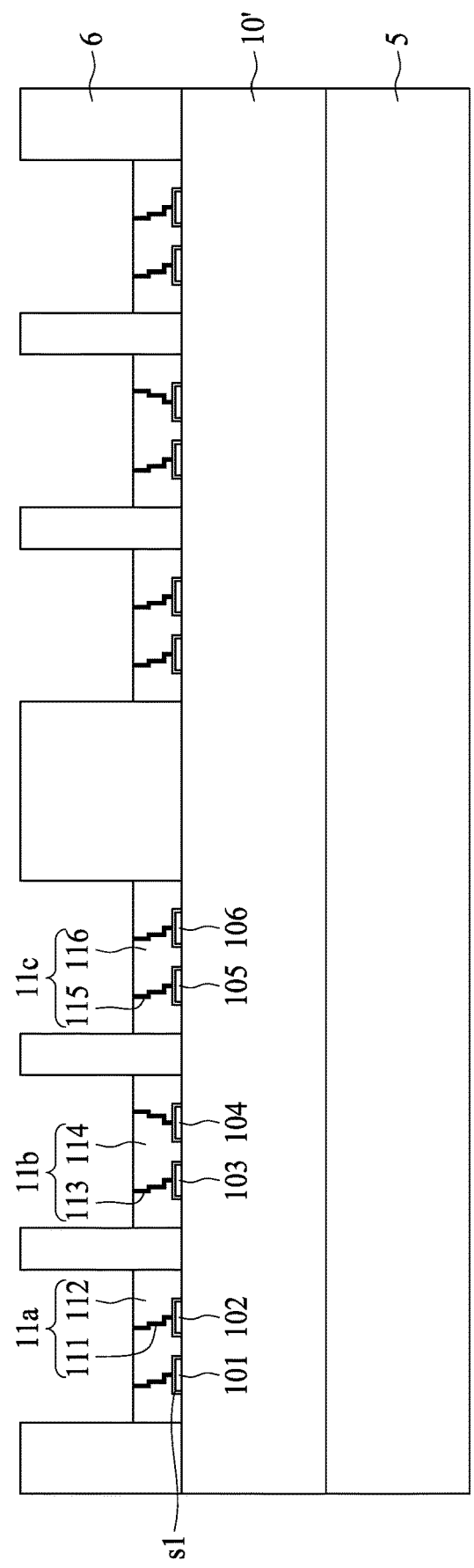

Referring to FIG. 1C, some redistribution structures 11a can be formed to cover the conductive terminals 101 and 102. Some redistribution structures 11b can be formed to cover the conductive terminals 103 and 104. Some redistribution structures 11c can be formed to cover the conductive terminals 105 and 106. The redistribution structures 11a can be electrically connected to the conductive terminals 101. The redistribution structure 11a can be electrically connected to the conductive terminal 102. The redistribution structure 11b can be electrically connected to the conductive terminal 103. The redistribution structure 11b can be electrically connected to the conductive terminal 104. The redistribution structure 11c can be electrically connected to the conductive terminal 105. The redistribution structure 11c can be electrically connected to the conductive terminal 106.

The redistribution structures 11a, 11b and 11c can be formed by, for example but is not limited to, photolithography technique or other suitable technique(s). The redistribution structures 11a, 11b and 11c can be formed by, for example but is not limited to, plating technique (e.g. electroplating) or other suitable technique(s).

The redistribution structures 11a is separated from the redistribution structure 11b by the pattered mask 6. The redistribution structures 11a is separated from the redistribution structure 11c by the pattered mask 6. The redistribution structures 11b is separated from the redistribution structure 11c by the pattered mask 6.

The redistribution structures 11a can include a redistribution circuitry 111 and an insulation layer 112. The redistribution structures 11b can include a redistribution circuitry 113 and an insulation layer 114. The redistribution structures 11c can include a redistribution circuitry 115 and an insulation layer 116.

A conductive layer or seed layer s1 can be formed on each of an upper surface of the conductive terminals 101, 102, 103, 104, 105, and 106. A conductive layer or seed layer s1 can be formed on each of a lateral surface of the conductive terminals 101, 102, 103, 104, 105, and 106. The conductive layer s1 can be formed by, for example but is not limited to, sputtering, deposition (e.g. physical vapor deposition (PVD)) or other suitable technique(s). The conductive layer s1 can be formed by, for example but is not limited to, etching or other suitable technique(s).

Figure 1D:
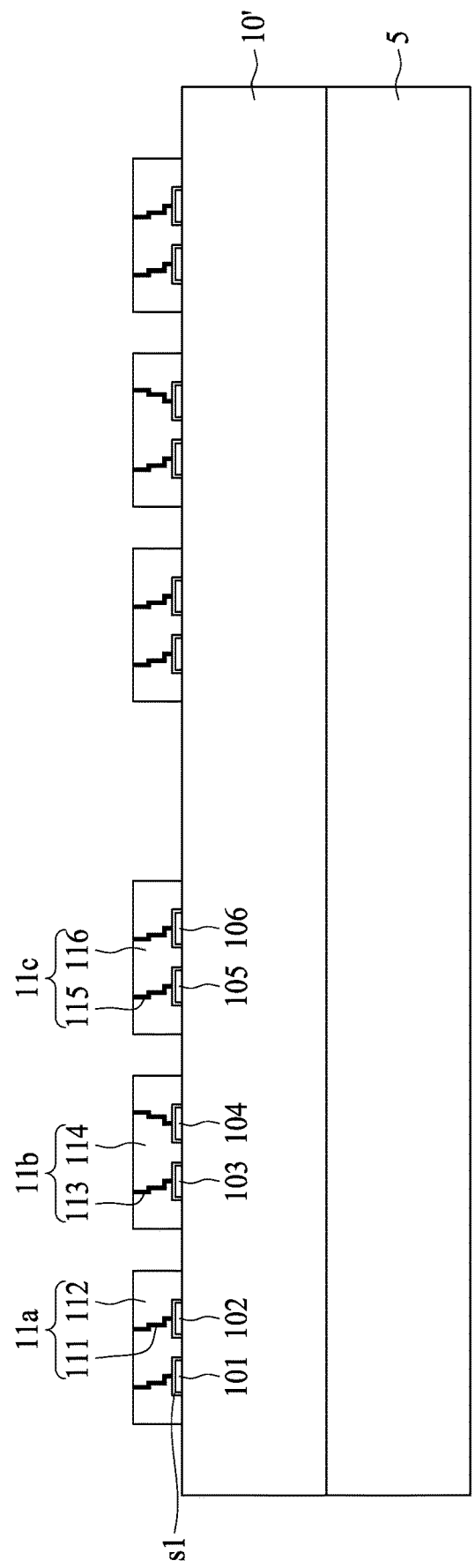

Referring to FIG. 1D, the patterned mask 6 is removed. The patterned mask 6 can be removed by, for example but is not limited to, striping, etching or other suitable technique(s).

Figure 1E:
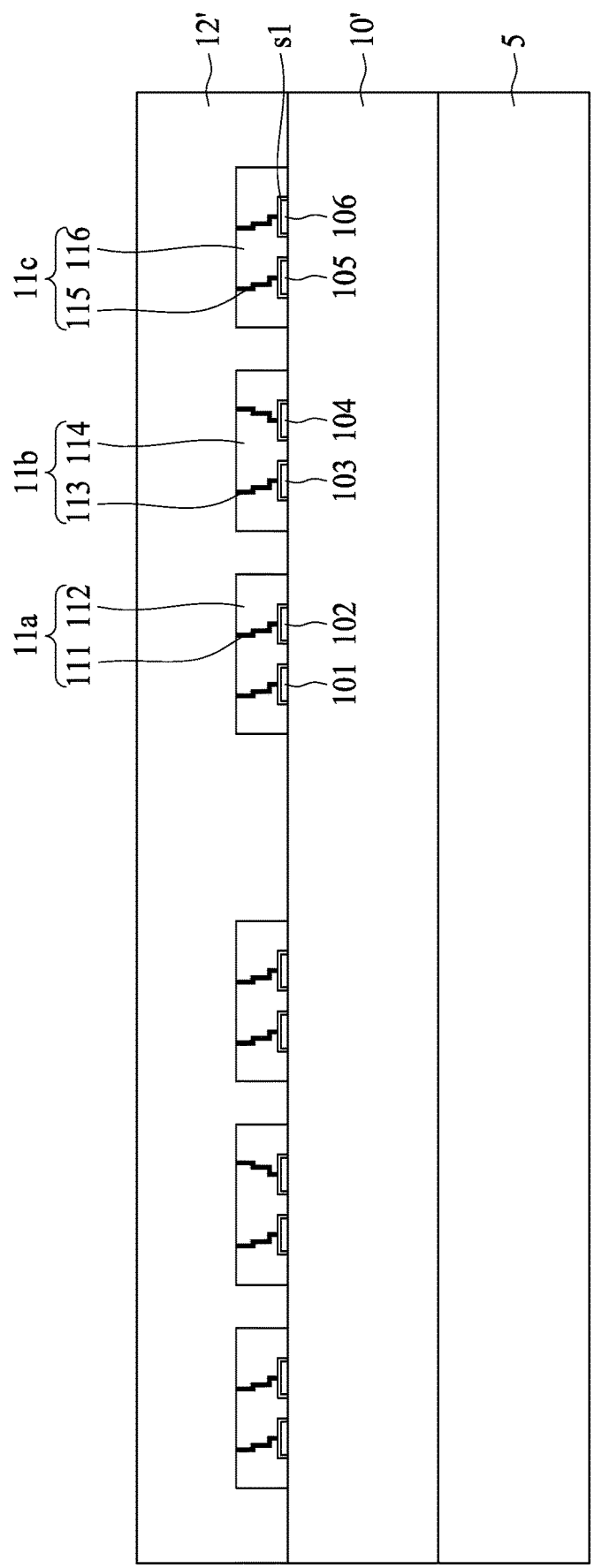

Referring to FIG. 1E, an insulation layer 12' is formed on the wafer 10'. The insulation layer 12' can be formed to cover the redistribution structures 11a, 11b and 11c.

The insulation layer 12' can be formed by, for example but is not limited to, sputtering, deposition (e.g. chemical vapor deposition (CVD)) technique or other suitable technique(s). The insulation layer 12' can include, for example but is not limited to, silicon oxide or other suitable material(s).

Figure 1F:
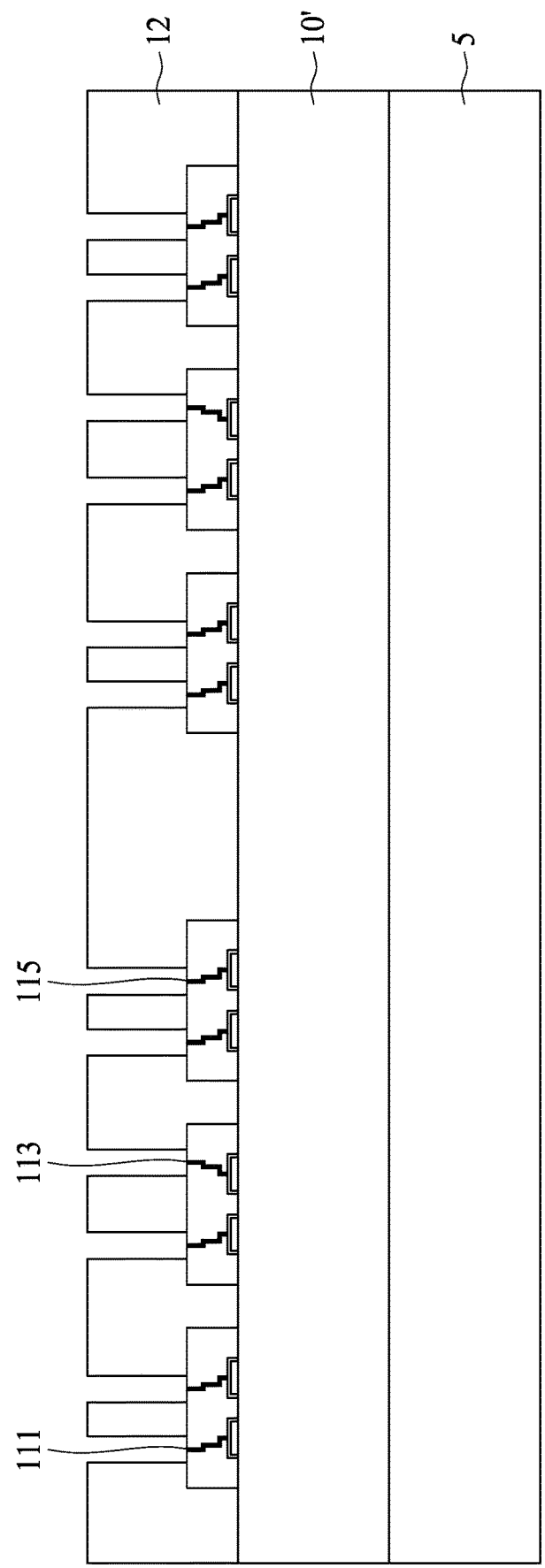

Referring to FIG. 1F, some openings (not denoted in FIG. 1F) can be formed to exposed the redistribution circuitry 111, the redistribution circuitry 113 and the redistribution circuitry 115. The openings can be formed by, for example but is not limited to, etching (e.g. dry etching) technique or other suitable technique(s).

Figure 1G:
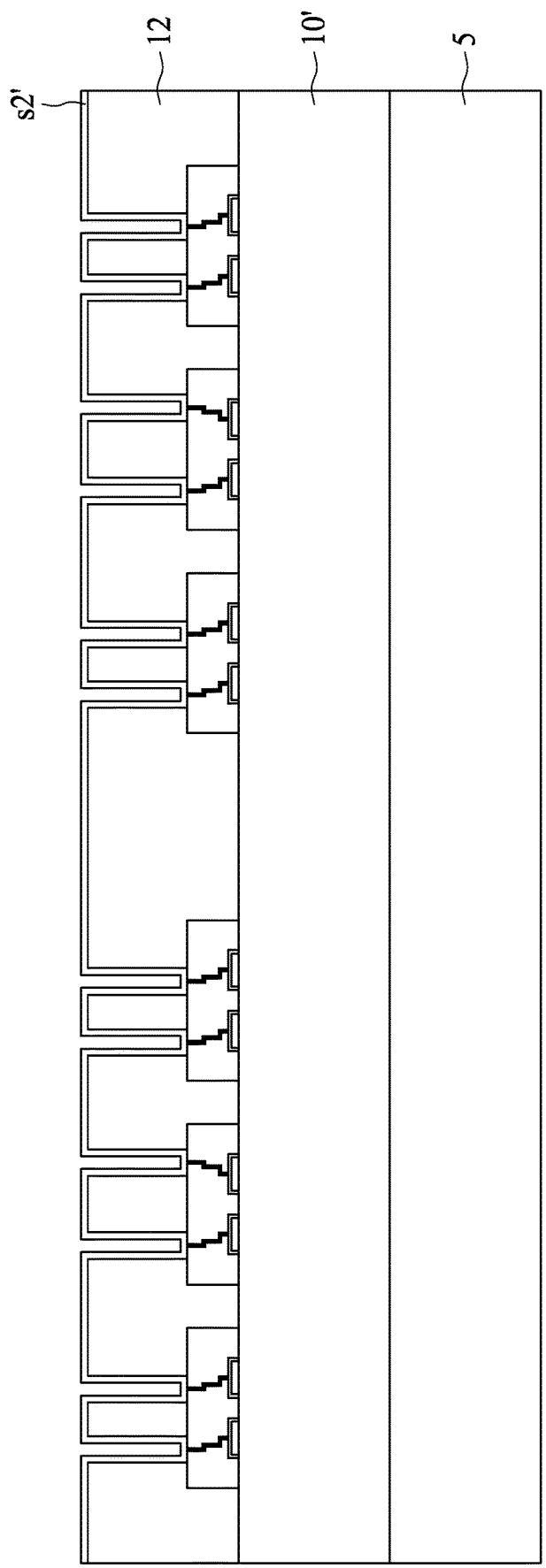

Referring to FIG. 1G, a conductive layer or seed layer s2' is formed by, for example but is not limited to, sputtering, deposition (e.g. physical vapor deposition (PVD)) or other suitable technique(s).

Figure 1H:
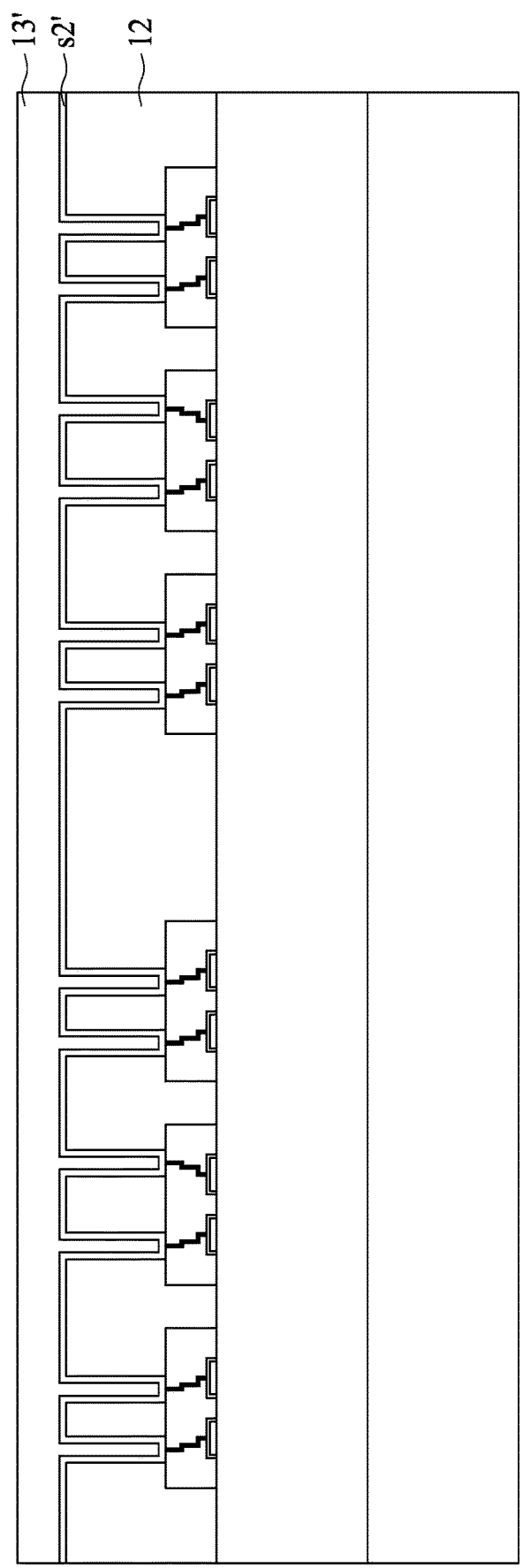

Referring to FIG. 1H, a conductive layer 13' is formed on the conductive layer s2'. The conductive layer 13' can be formed by, for example but is not limited to, plating technique (e.g. electroplating) or other suitable technique(s).

Figure 1I:
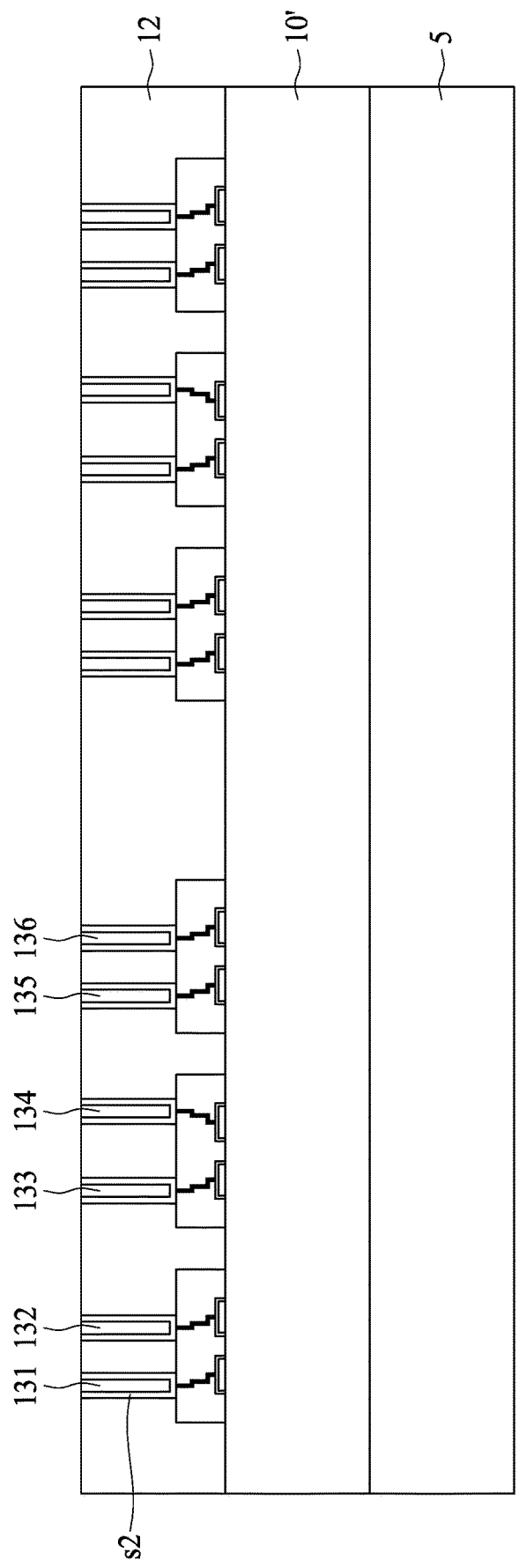

Referring to FIG. 1I, part of the conductive layer s2' and part of the conductive layer 13' as shown in FIG. 1H are removed to formed a conductive layer s2 and the conductive pillars 131, 132, 133, 134, 135, and 136.

The conductive layer s2 can be formed by, for example but is not limited to, photolithography technique) or other suitable technique(s). The conductive layer s2 can be formed by, for example but is not limited to, etching (e.g. wet etching) technique or other suitable technique(s).

The conductive pillars 131, 132, 133, 134, 135, and 136 can be formed by, for example but is not limited to, photolithography technique) or other suitable technique(s). The conductive pillars 131, 132, 133, 134, 135, and 136 can be formed by, for example but is not limited to, etching (e.g. wet etching) technique or other suitable technique(s).

Figure 1J:
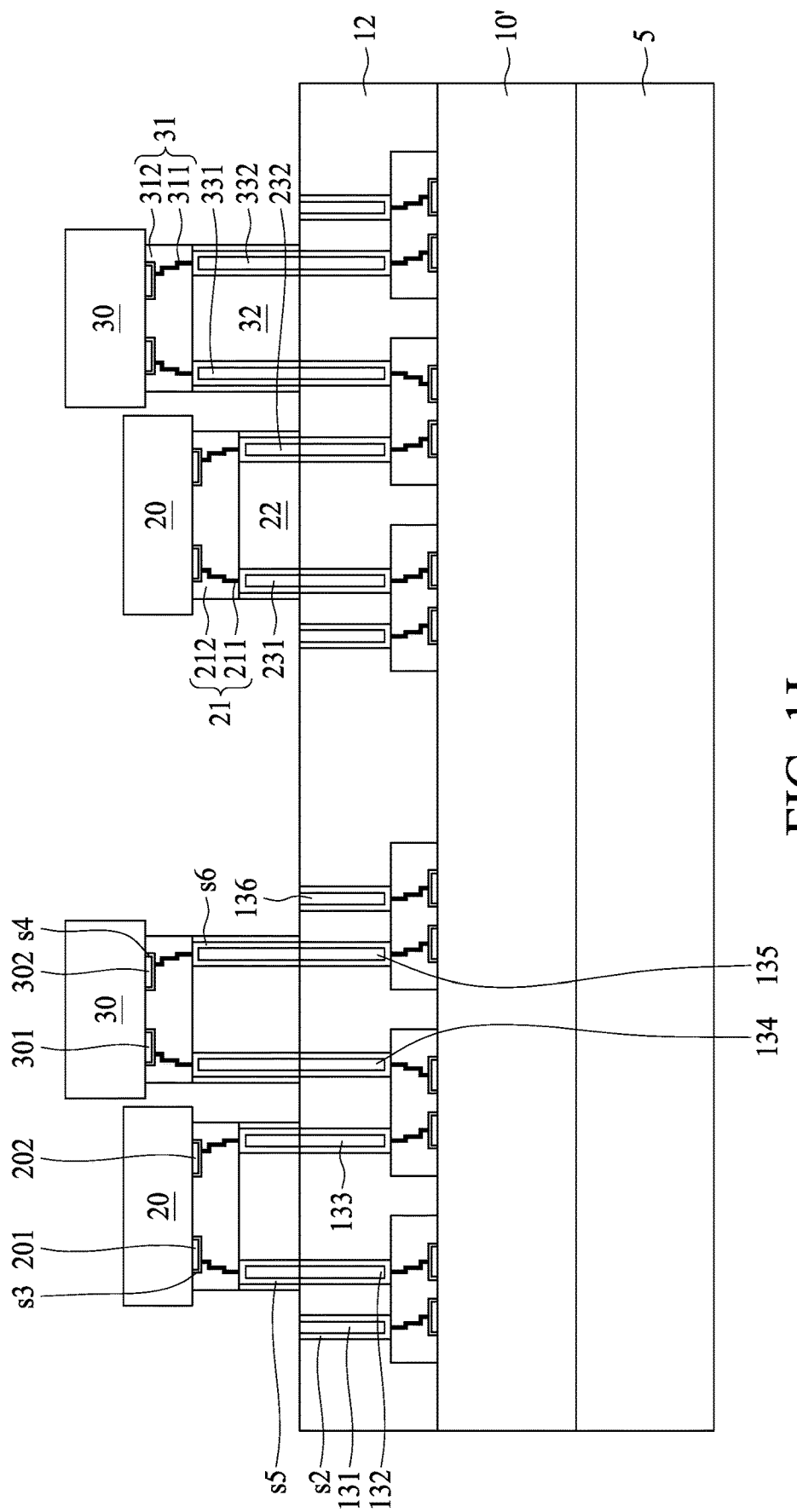

Referring to FIG. 1J, a semiconductor device package, which includes a semiconductor device 20 having conductive terminal 201 and 202, an RDL structure 21 covering the conductive terminal 201 and 202 and electrically connected to the semiconductor device 20, an interconnection structure including a conductive layer s5 and a conductive pillar 231, another interconnection structure including a conductive layer s5 and a conductive pillar 232, and an insulation layer 22, is bonded to the structure as shown in FIG. 1I.

The insulation layer 22 can be bonded to the insulation layer 12 by, for example but is not limited to, bonding (e.g. heat and pressure bonding) technique or other suitable technique(s). The conductive layer s5 can be bonded to the conductive layer s2 by, for example but is not limited to, bonding (e.g. heat and pressure bonding) technique or other suitable technique(s). The conductive pillar 231 can be bonded to the conductive pillar 132 by, for example but is not limited to, bonding (e.g. heat and pressure bonding) technique or other suitable technique(s). The conductive pillar 232 can be bonded to the conductive pillar 133 by, for example but is not limited to, bonding (e.g. heat and pressure bonding) technique or other suitable technique(s). The insulation layer 22 can include, for example but is not limited to, silicon oxide or other suitable material(s).

Another semiconductor device package, which includes a semiconductor device 30 having conductive terminal 301 and 302, an RDL structure 31 covering the conductive terminal 301 and 302 and electrically connected to the semiconductor device 30, an interconnection structure including a conductive layer s6 and a conductive pillar 331, another interconnection structure including a conductive layer s6 and a conductive pillar 332, and an insulation layer 32, is bonded to the structure as shown in FIG. 1I. The insulation layer 32 can include, for example but is not limited to, silicon oxide or other suitable material(s).

The insulation layer 32 can be bonded to the insulation layer 12 by, for example but is not limited to, bonding (e.g. heat and pressure bonding) technique or other suitable technique(s). The conductive layer s6 can be bonded to the conductive layer s2 by, for example but is not limited to, bonding (e.g. heat and pressure bonding) technique or other suitable technique(s). The conductive pillar 331 can be bonded to the conductive pillar 134 by, for example but is not limited to, bonding (e.g. heat and pressure bonding) technique or other suitable technique(s). The conductive pillar 332 can be bonded to the conductive pillar 135 by, for example but is not limited to, bonding (e.g. heat and pressure bonding) technique or other suitable technique(s).

The operation as shown in FIG. 1J can be performed by, for example but is not limited to, die to wafer bonding or other suitable technique(s).

Figure 1K:
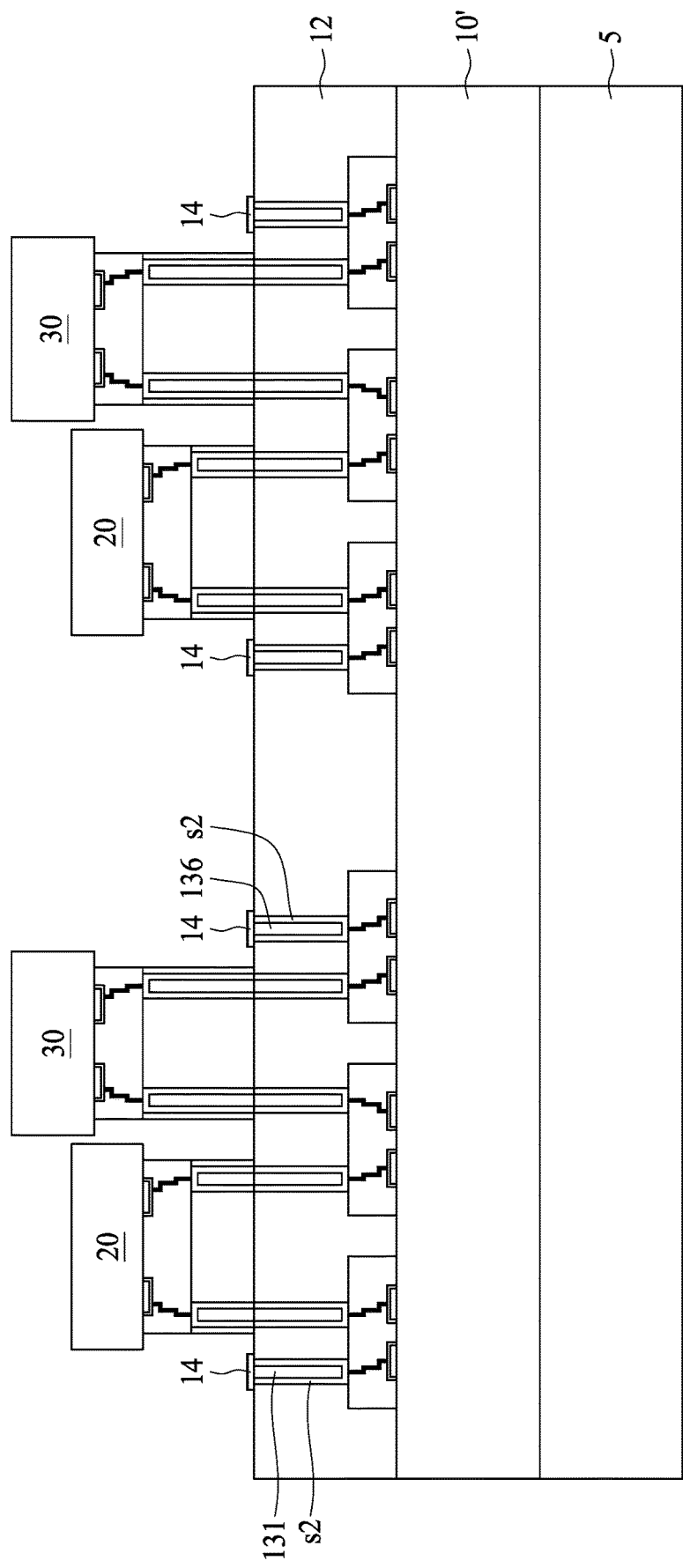

Referring to FIG. 1K, an anti-oxidation structure 14 can be formed to cover the conductive pillar 131. The anti-oxidation structure 14 can be formed to cover the conductive layer s2. The anti-oxidation structure 14 can be formed to cover the conductive pillar 136.

The anti-oxidation structure 14 can be formed by, for example but is not limited to, deposition (e.g. electroless deposition), plating (e.g. electroless plating) or other suitable technique(s). The anti-oxidation structure 14 can include, for example but is not limited to, nickel (Ni), platinum (Pt), gold (Au), palladium (Pd) or other suitable material(s). The anti-oxidation structure 14 can include conductive material(s). The anti-oxidation structure 14 can include material(s) which can be resistant to corrosion or oxidation. The anti-oxidation structure 14 can include anti-oxidation material(s).

A width of the anti-oxidation structure 14 can be controlled to be greater than or equal to the conductive layer s2. A width of the anti-oxidation structure 14 can be controlled to be greater than the conductive pillar 131. A width of the anti-oxidation structure 14 can be controlled to be greater than the conductive pillar 136.

Figure 1L:
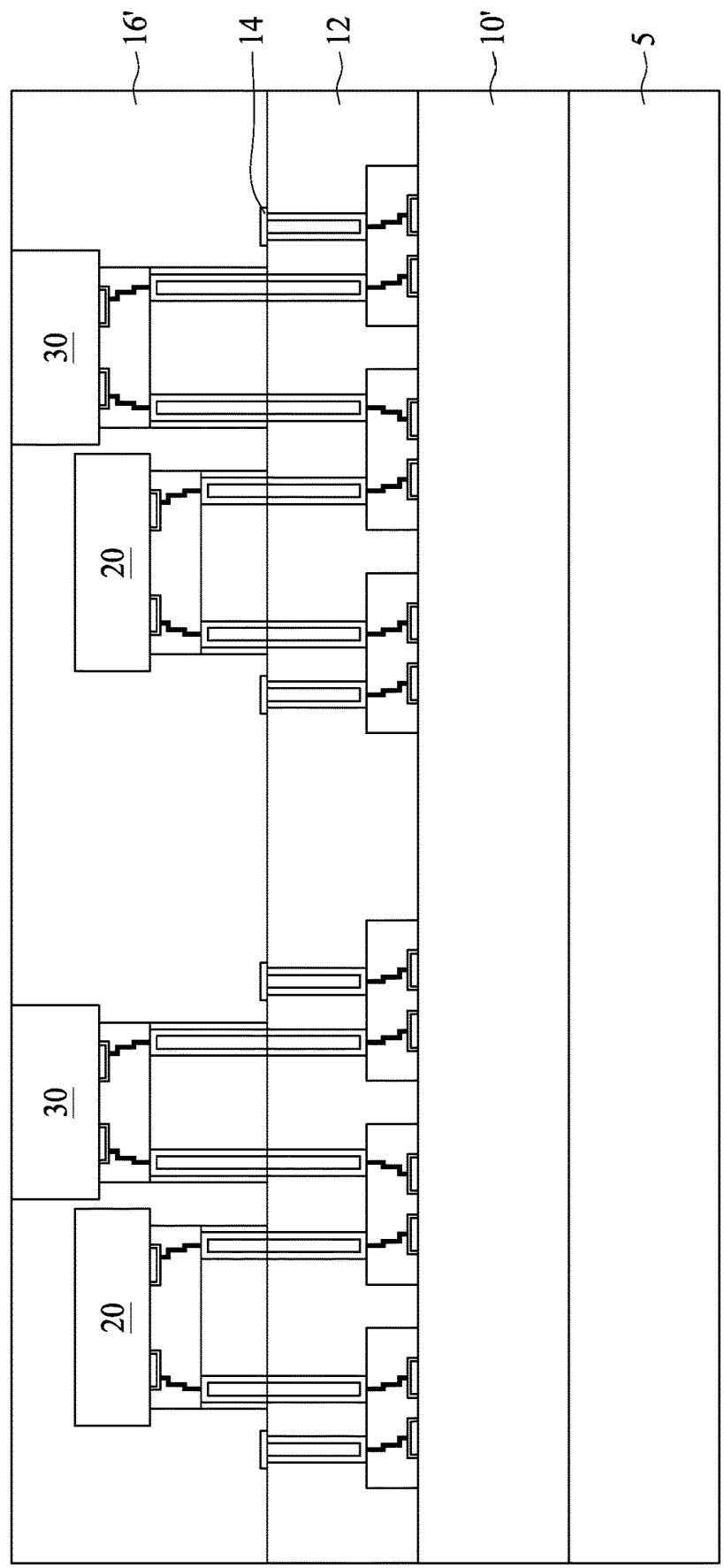

Referring to FIG. 1L, an insulation layer 16' can be formed on the insulation layer 12. The insulation layer 16' can be formed to cover the anti-oxidation structure 14. The insulation layer 16' can be formed to cover the semiconductor device package 20. The insulation layer 16' can be formed to expose the semiconductor device package 30.

The insulation layer 16' can be formed by, for example but is not limited to, photolithography technique (which may involve coating, exposure, developing) or other suitable technique(s). The insulation layer 16' can be formed by, for example but is not limited to, curing, hardening, or other suitable technique(s). During the curing operation, the insulation layer 16' may have to be heated to a temperature which can be range from approximately 230° C. to approximately 280° C. for at least three hours. In other words, the structure as shown in FIG. 1L may be disposed in a relatively high-temperature environment (e.g. an oven) for a relatively long time.

The insulation layer 16' can include, for example but is not limited to, polyimide (PI) or other suitable material(s).

Figure 1M:
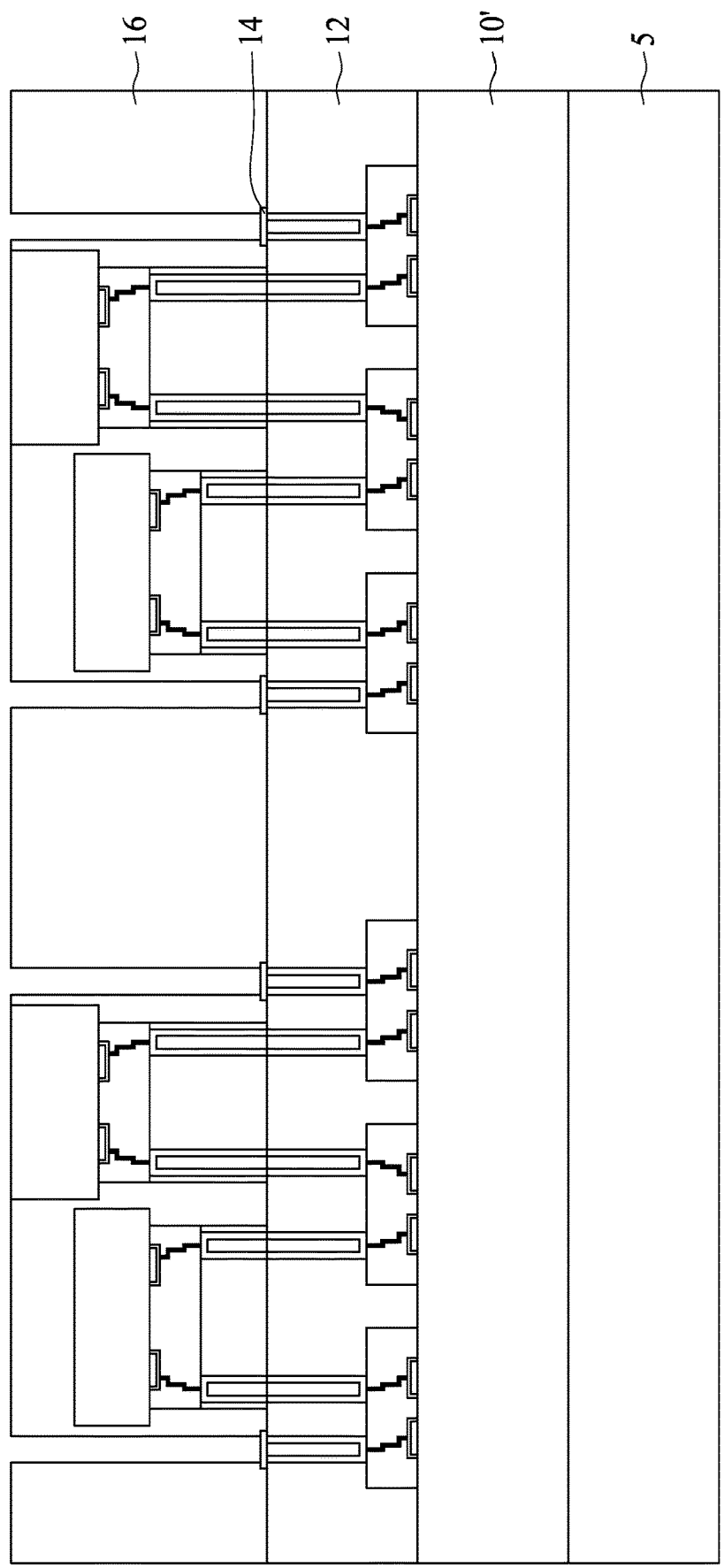

Referring to FIG. 1M, some openings (not denoted) are formed to expose the anti-oxidation structures 14. The openings, or the insulation layer 16, can be formed by, for example but is not limited to, laser drilling, mechanical drilling, or other suitable technique(s). Dry etching technique may not be applied in the operation as shown in FIG. 1M if the insulation layer 16' include PI. However, dry etching technique can be used assuming the insulation layer 16' including silicon oxide or other suitable material(s).

The anti-oxidation structures 14 can function as a stop layer during the operation of laser drilling. The anti-oxidation structures 14 can prevent the conductive pillar 131 from oxidation or corrosion during the operation of forming the openings as shown in FIG. 1M, which can produce a significant amount of heat. The anti-oxidation structures 14 can prevent the conductive pillar 136 from oxidation or corrosion during the operation of forming the openings as shown in FIG. 1M, which can produce a significant amount of heat. The anti-oxidation structures 14 can prevent the conductive layer s2 from oxidation or corrosion during the operation of forming the openings as shown in FIG. 1M, which can produce a significant amount of heat.

Figure 1N:
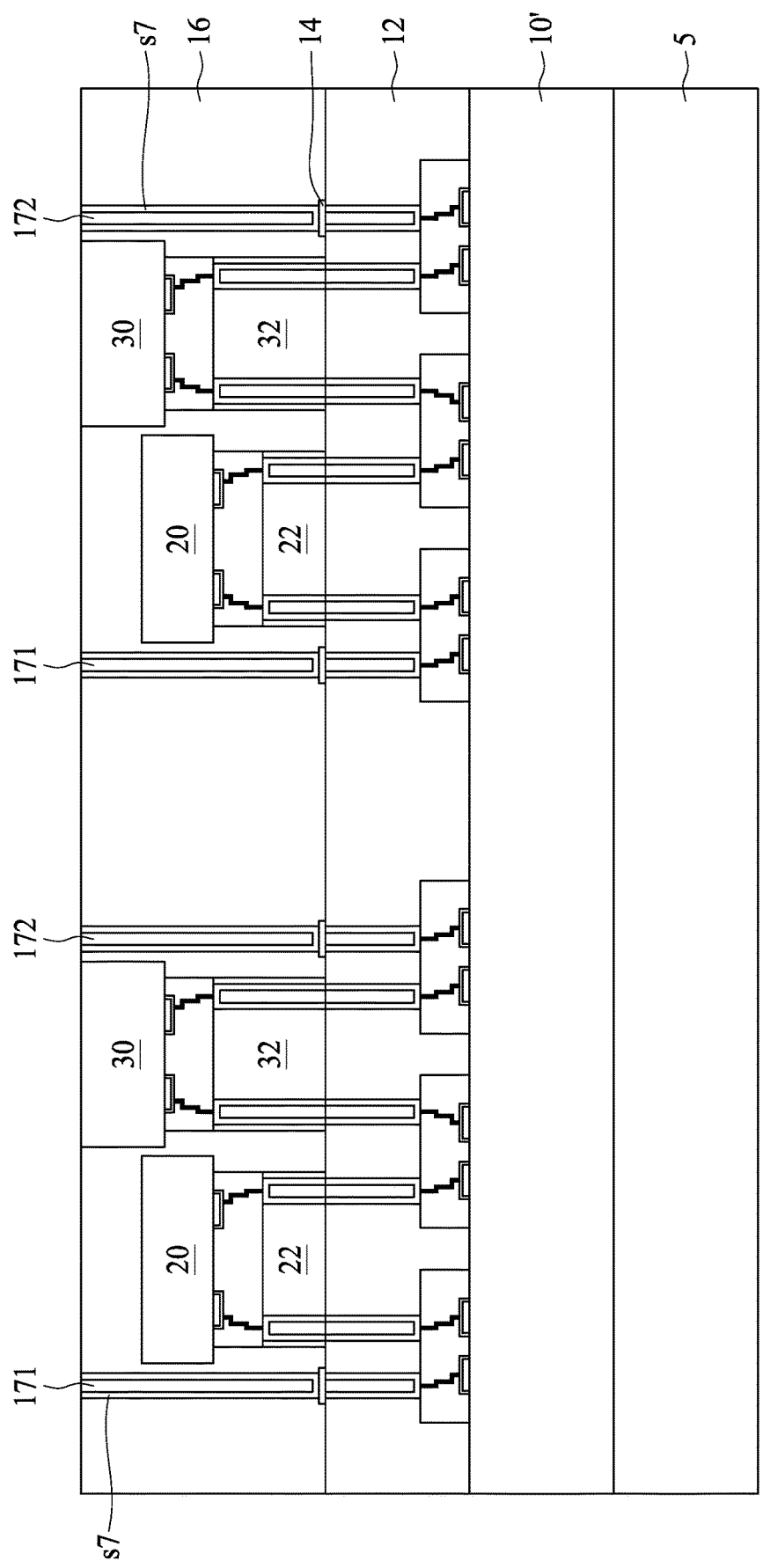

Referring to FIG. 1N, conductive layers s7, conductive pillars 171 and a conductive pillars 172 can be formed. The conductive layers s7, conductive pillars 171 and a conductive pillars 172 can be formed by the operations as described and illustrated with reference to FIG. 1G, FIG. 1H, and FIG. 1I.

An RDL structure 18 and conductive elements 19 can be formed on the structure as shown in FIG. 1N, which can be singulated or cut to form some semiconductor device packages 1a as described and illustrated with reference to FIG. 1. The carrier 5 can be removed prior to performing the cutting operation. The carrier 5 can be removed subsequent to performing the cutting operation.

Figure 2:
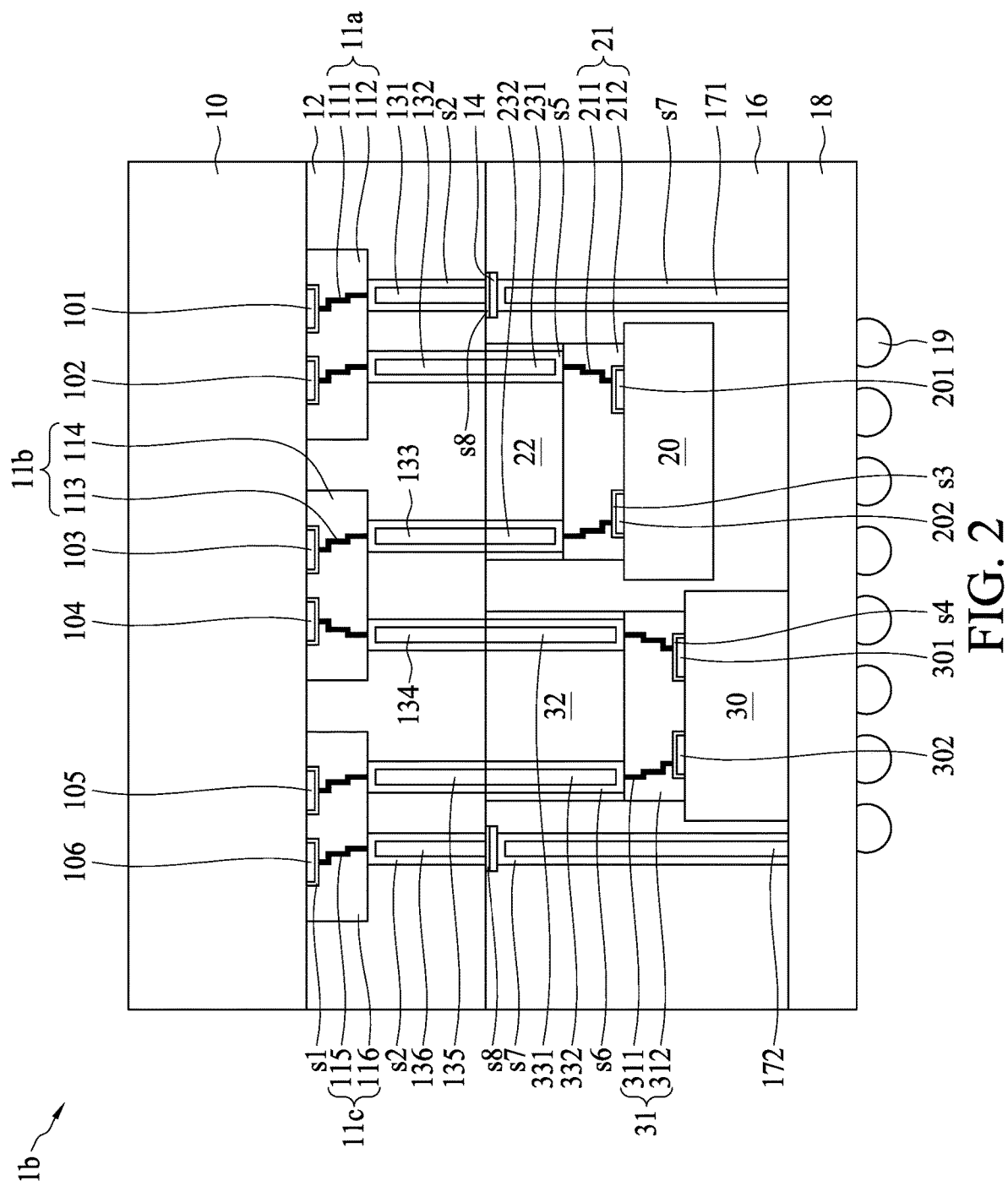
FIG. 2 is a cross-sectional view of another semiconductor device package in accordance with some embodiments of the present disclosure.

FIG. 2 is a cross-sectional view of another semiconductor device package in accordance with some embodiments of the present disclosure.

Referring to FIG. 2, the semiconductor device package 1b is similar to the semiconductor device package 1a as illustrated and described with reference to FIG. 1, except that a conductive layer s8 is disposed between the anti-oxidation structure 14 and the insulation layer 12.

The conductive layer s8 can include a single-layer structure. The conductive layer s8 can include a multi-layer structure. The conductive layer s8 can function as a seed layer during manufacture of the semiconductor device package 1b (e.g. during electroplating operation). The conductive layer s8 can include, for example but is not limited to, titanium (Ti), copper (Cu), TiCu, or other conductive material(s).

The conductive layer s8 can have a width substantially the same to the anti-oxidation structure 14. The conductive layer s8 can be in direct contact with the anti-oxidation structure 14. The conductive layer s8 can be in direct contact with the insulation layer 12. The conductive layer s8 can be in direct contact with the conductive layer s2. The conductive layer s8 can be in direct contact with the conductive pillar 131. The conductive layer s8 can be in direct contact with the conductive pillar 136.

The conductive layer s8 can be disposed between the anti-oxidation structure 14 and the conductive layer s2. The conductive layer s8 can be disposed between the anti-oxidation structure 14 and the conductive pillar 131. The conductive layer s8 can be disposed between the anti-oxidation structure 14 and the conductive pillar 136.

Method for manufacturing the semiconductor device package 1b can be similar to the operations as illustrated and described with reference to FIG. 1A, FIG. 1B, FIG. 1C, FIG. 1D, FIG. 1E, FIG. 1F, FIG. 1G, FIG. 1H, FIG. 1I, FIG. 1J, FIG. 1K, FIG. 1L, FIG. 1M and FIG. 1N, except that the conductive layer s8 can be formed in the operation as shown in FIG. 1K prior to forming the anti-oxidation structure 14. The conductive layer s8 can be formed by, for example but is not limited to, sputtering, deposition (e.g. physical vapor deposition (PVD)) or other suitable technique(s). The conductive layer s8 can be formed by, for example but is not limited to, etching or other suitable technique(s). The conductive layer s8 can facilitate forming the anti-oxidation structure 14 if electroplating technique is used.

Figure 3:
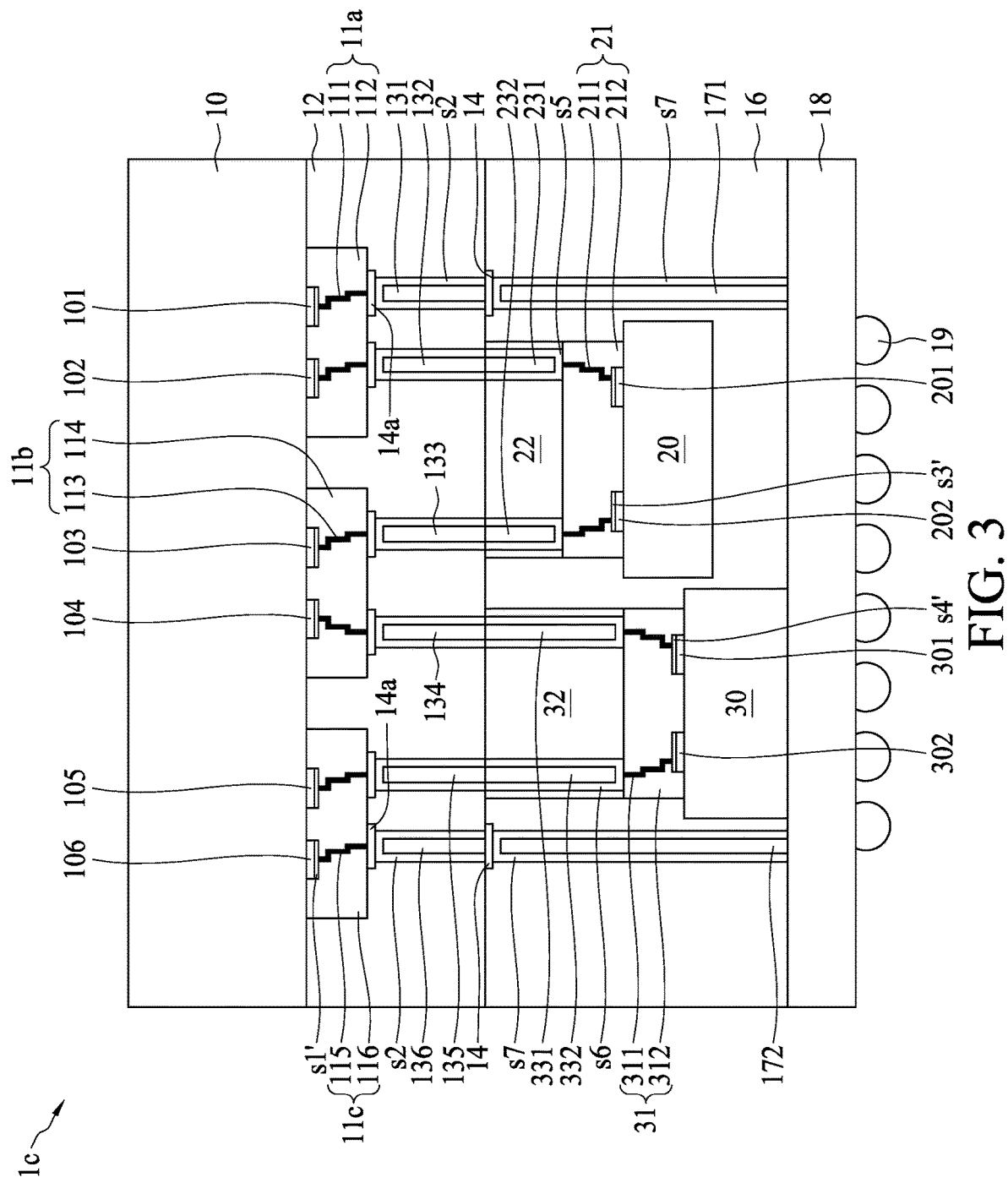
FIG. 3 is a cross-sectional view of another semiconductor device package in accordance with some embodiments of the present disclosure.

FIG. 3 is a cross-sectional view of another semiconductor device package in accordance with some embodiments of the present disclosure.

Referring to FIG. 3, the semiconductor device package 1c is similar to the semiconductor device package 1a as illustrated and described with reference to FIG. 1, except that each of the conductive layers s1 is replaced by a conductive layers s1', each of the conductive layers s3 is replaced by a conductive layers s3', each of the conductive layers s4 is replaced by a conductive layers s4', and some anti-oxidation structures 14a are disposed between the conductive layers s2 and the RDL structures 11a, 11b and 11c.

The conductive layers s1' are similar to the conductive layers s1 as illustrated and described with reference to FIG. 1, except that each of conductive layers s1' covers the lower surface of each of the conductive terminals 101, 102, 103, 104, 105, and 106. Each of conductive layers s1' may not cover the lateral surface of each of the conductive terminals 101, 102, 103, 104, 105, and 106. Each of conductive layers s1' selectively covers the lower surface of each of the conductive terminals 101, 102, 103, 104, 105, and 106.

The conductive layers s3' are similar to the conductive layers s3 as illustrated and described with reference to FIG. 1, except that each of conductive layers s3' covers the upper surface of each of the conductive terminals 201 and 202. Each of conductive layers s3' may not cover the lateral surface of each of the conductive terminals 201 and 202. Each of conductive layers s3' selectively covers the upper surface of each of the conductive terminals 201 and 202.

The conductive layers s4' are similar to the conductive layers s4 as illustrated and described with reference to FIG. 1, except that each of conductive layers s4' covers the upper surface of each of the conductive terminals 301 and 302. Each of conductive layers s4' may not cover the lateral surface of each of the conductive terminals 301 and 302. Each of conductive layers s4' selectively covers the upper surface of each of the conductive terminals 301 and 302.

The anti-oxidation structure 14a can have a structure same or similar to the anti-oxidation structure 14. The anti-oxidation structure 14a can have a structure different from the anti-oxidation structure 14.

The anti-oxidation structure 14a can be in direct contact with the redistribution circuitry 111. The anti-oxidation structure 14a can be in direct contact with the insulation layer 112. The anti-oxidation structure 14a can be in direct contact with the redistribution circuitry 113. The anti-oxidation structure 14a can be in direct contact with the insulation layer 114. The anti-oxidation structure 14a can be in direct contact with the redistribution circuitry 115. The anti-oxidation structure 14a can be in direct contact with the insulation layer 116. The anti-oxidation structure 14a can be surrounded by the insulation layer 12.

The anti-oxidation structure 14a can be disposed on the conductive layer s2. The anti-oxidation structure 14a can be in direct contact with the conductive layer s2. The anti-oxidation structure 14a can be disposed on the conductive pillar 131. The anti-oxidation structure 14a can be disposed on the conductive pillar 132. The anti-oxidation structure 14a can be disposed on the conductive pillar 133. The anti-oxidation structure 14a can be disposed on the conductive pillar 134. The anti-oxidation structure 14a can be disposed on the conductive pillar 135. The anti-oxidation structure 14a can be disposed on the conductive pillar 136.

The anti-oxidation structure 14a can have a width greater than the conductive layer s2. The anti-oxidation structure 14a can have a width greater than the conductive pillar 131. The anti-oxidation structure 14a can have a width greater than the conductive pillar 132. The anti-oxidation structure 14*a* can have a width greater than the conductive pillar 133. The anti-oxidation structure 14*a* can have a width greater than the conductive pillar 134. The anti-oxidation structure 14*a* can have a width greater than the conductive pillar 135. The anti-oxidation structure 14*a* can have a width greater than the conductive pillar 136.

The anti-oxidation structure 14*a* can have a width greater than the interconnection structure which includes the conductive layer s2 and the conductive pillar 131. The anti-oxidation structure 14*a* can have a width greater than the interconnection structure which includes the conductive layer s2 and the conductive pillar 132. The anti-oxidation structure 14*a* can have a width greater than the interconnection structure which includes the conductive layer s2 and the conductive pillar 133. The anti-oxidation structure 14*a* can have a width greater than the interconnection structure which includes the conductive layer s2 and the conductive pillar 134. The anti-oxidation structure 14*a* can have a width greater than the interconnection structure which includes the conductive layer s2 and the conductive pillar 135. The anti-oxidation structure 14*a* can have a width greater than the interconnection structure which includes the conductive layer s2 and the conductive pillar 136.

Although it is not illustrated, it is contemplated that the anti-oxidation structure 14*a* can have a width equal to the conductive layer s2 in accordance with some other embodiments of the subject application. Although it is not illustrated, it is contemplated that the anti-oxidation structure 14*a* can have a width equal to the interconnection structure which includes the conductive layer s2 and the conductive pillar 131 in accordance with some other embodiments of the subject application. Although it is not illustrated, it is contemplated that the anti-oxidation structure 14*a* can have a width equal to the interconnection structure which includes the conductive layer s2 and the conductive pillar 132 in accordance with some other embodiments of the subject application. Although it is not illustrated, it is contemplated that the anti-oxidation structure 14*a* can have a width equal to the interconnection structure which includes the conductive layer s2 and the conductive pillar 133 in accordance with some other embodiments of the subject application. Although it is not illustrated, it is contemplated that the anti-oxidation structure 14*a* can have a width equal to the interconnection structure which includes the conductive layer s2 and the conductive pillar 134 in accordance with some other embodiments of the subject application. Although it is not illustrated, it is contemplated that the anti-oxidation structure 14*a* can have a width equal to the interconnection structure which includes the conductive layer s2 and the conductive pillar 135 in accordance with some other embodiments of the subject application. Although it is not illustrated, it is contemplated that the anti-oxidation structure 14*a* can have a width equal to the interconnection structure which includes the conductive layer s2 and the conductive pillar 136 in accordance with some other embodiments of the subject application.

FIG. 3A, FIG. 3B, FIG. 3C, FIG. 3D, FIG. 3E, FIG. 3F, FIG. 3G, FIG. 3H, FIG. 3I, FIG. 3J, FIG. 3K, FIG. 3L, FIG. 3M and FIG. 3N illustrate various stages of a method for manufacturing a semiconductor device package accordance with some embodiments of the subject application.

Figure 3A:
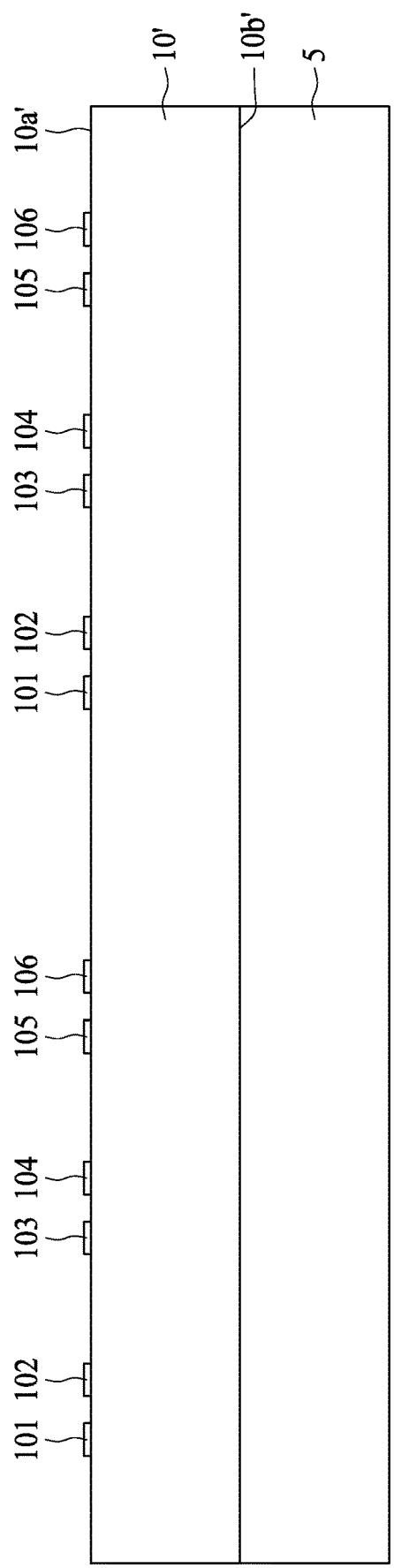
FIG. 3A, FIG. 3B, FIG. 3C, FIG. 3D, FIG. 3E, FIG. 3F, FIG. 3G, FIG. 3H, FIG. 3I, FIG. 3J, FIG. 3K, FIG. 3L, FIG. 3M and FIG. 3N illustrate various stages of a method for manufacturing a semiconductor device package accordance with some embodiments of the subject application.

Referring to FIG. 3A, a wafer 10' can be provided or disposed on a carrier 5. The wafer 10' can include some semiconductor devices (or dies) same or similar to the semiconductor device 10 as illustrated and described with reference to FIG. 3. Each of the semiconductor device can include conductive terminals 101, 102, 103, 104, 105 and 106.

The wafer 10' may have an upper surface 10*a*' and a lower surface 10*b*'. The conductive terminals 101, 102, 103, 104, 105 and 106 can be formed or disposed on the upper surface 10*a*' of the wafer 10'.

The lower surface 10*b*' of the wafer 10' can be bonded or attached to the carrier 5.

Figure 3B:
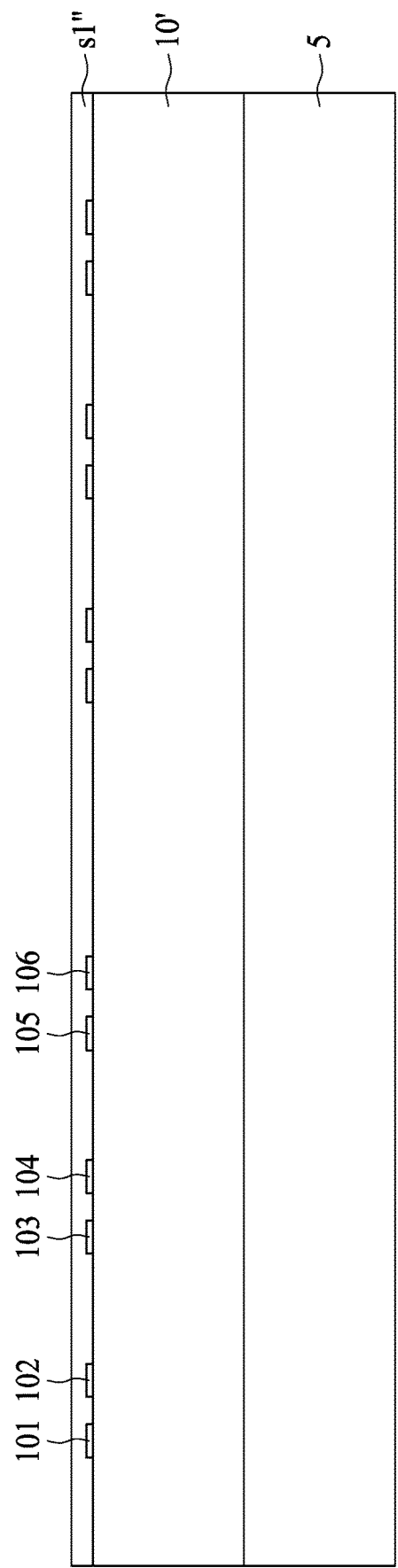

Referring to FIG. 3B, a conductive layer s1" can be formed on the upper surface 10*a*' of the wafer 10'.

The conductive layer or seed layer s1" can be formed to cover the conductive terminals 101, 102, 103, 104, 105, and 106. The conductive layer s1" can be formed by, for example but is not limited to, sputtering, deposition (e.g. physical vapor deposition (PVD)) or other suitable technique(s). The conductive layer s1" can have material same or similar to the conductive layer s1. The conductive layer s1" can have material different from the conductive layer s1.

Figure 3C:
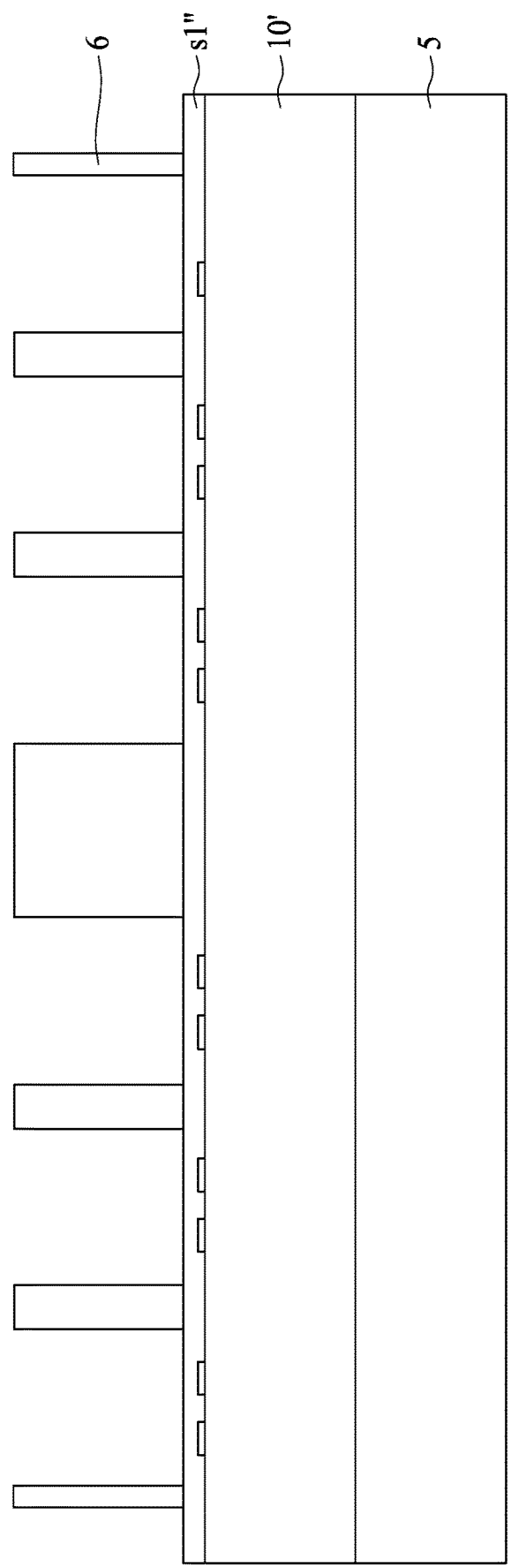

Referring to FIG. 3C, a patterned mask 6 can be formed on the conductive layer s1".

The patterned mask (or photomask) 6 can include, for example but is not limited to, photoresist (PR) material or other suitable material(s). The patterned mask 6 can be formed by, for example but is not limited to, photolithography technique (which may involve coating, exposure, developing) or other suitable technique(s).

Figure 3D:
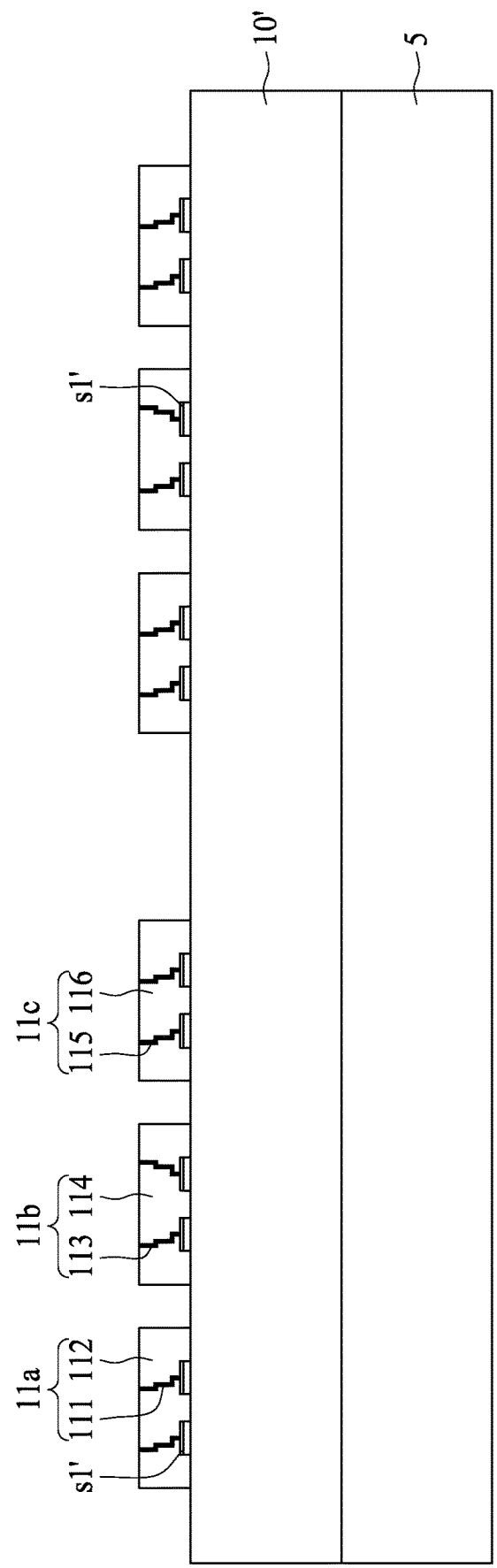

Referring to FIG. 3D, some redistribution structures 11*a* can be formed to cover the conductive terminals 101 and 102. Some redistribution structures 11*b* can be formed to cover the conductive terminals 103 and 104. Some redistribution structures 11*c* can be formed to cover the conductive terminals 105 and 106. The redistribution structures 11*a* can be electrically connected to the conductive terminals 101. The redistribution structure 11*a* can be electrically connected to the conductive terminal 102. The redistribution structure 11*b* can be electrically connected to the conductive terminal 103. The redistribution structure 11*b* can be electrically connected to the conductive terminal 104. The redistribution structure 11*c* can be electrically connected to the conductive terminal 105. The redistribution structure 11*c* can be electrically connected to the conductive terminal 106.

The redistribution structures 11*a*, 11*b* and 11*c* can be formed by, for example but is not limited to, photolithography technique or other suitable technique(s). The redistribution structures 11*a*, 11*b* and 11*c* can be formed by, for example but is not limited to, plating technique (e.g. electroplating) or other suitable technique(s).

The redistribution structures 11*a* is separated from the redistribution structure 11*b*. The redistribution structures 11*a* is separated from the redistribution structure 11*c*. The redistribution structures 11*b* is separated from the redistribution structure 11*c*.

The redistribution structures 11*a* can include a redistribution circuitry 111 and an insulation layer 112. The redistribution structures 11*b* can include a redistribution circuitry 113 and an insulation layer 114. The redistribution structures 11*c* can include a redistribution circuitry 115 and an insulation layer 116.

During the operation of forming the above RDL structures 11*a*, 11*b* and 11*c*, part of the conductive layer s1" can be removed to form the conductive layer s1'. The conductive layer s1' can be formed by, for example but is not limited to, etching or other suitable technique(s).

Figure 3E:
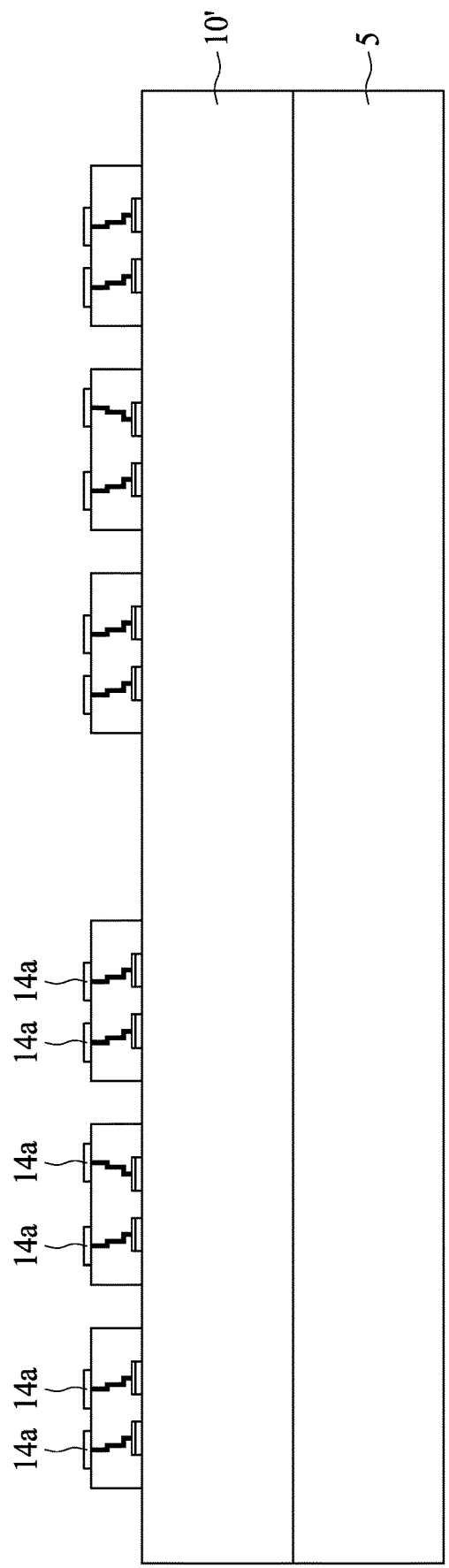
Figure 3F:
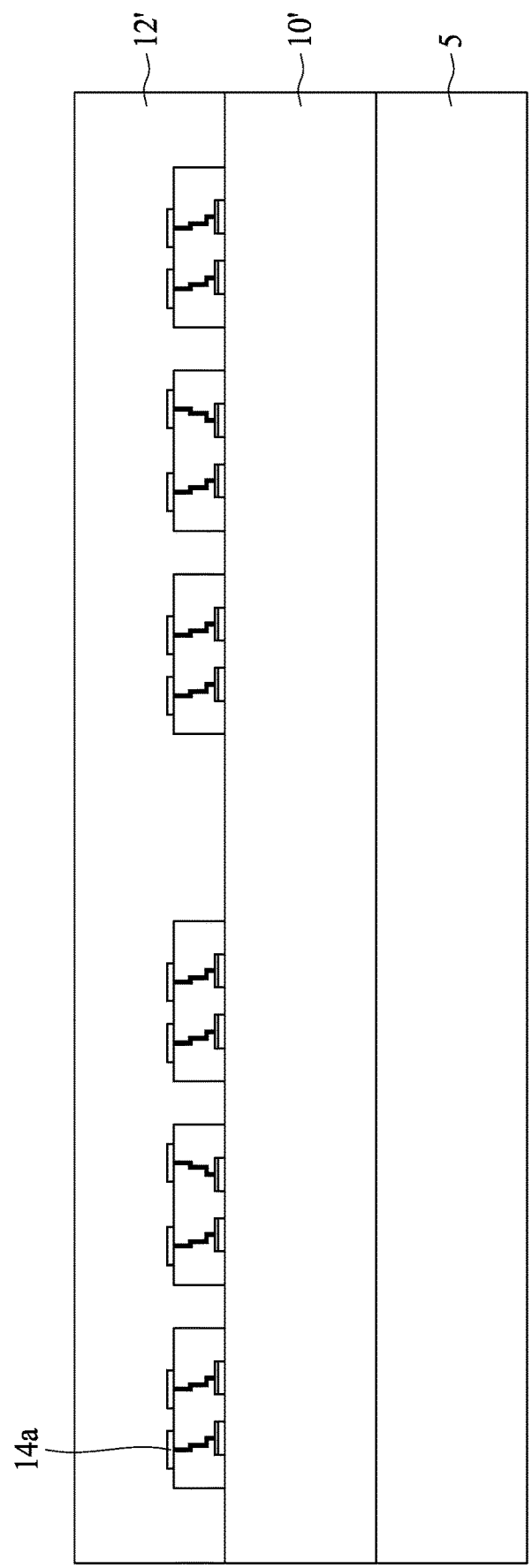
Figure 3G:
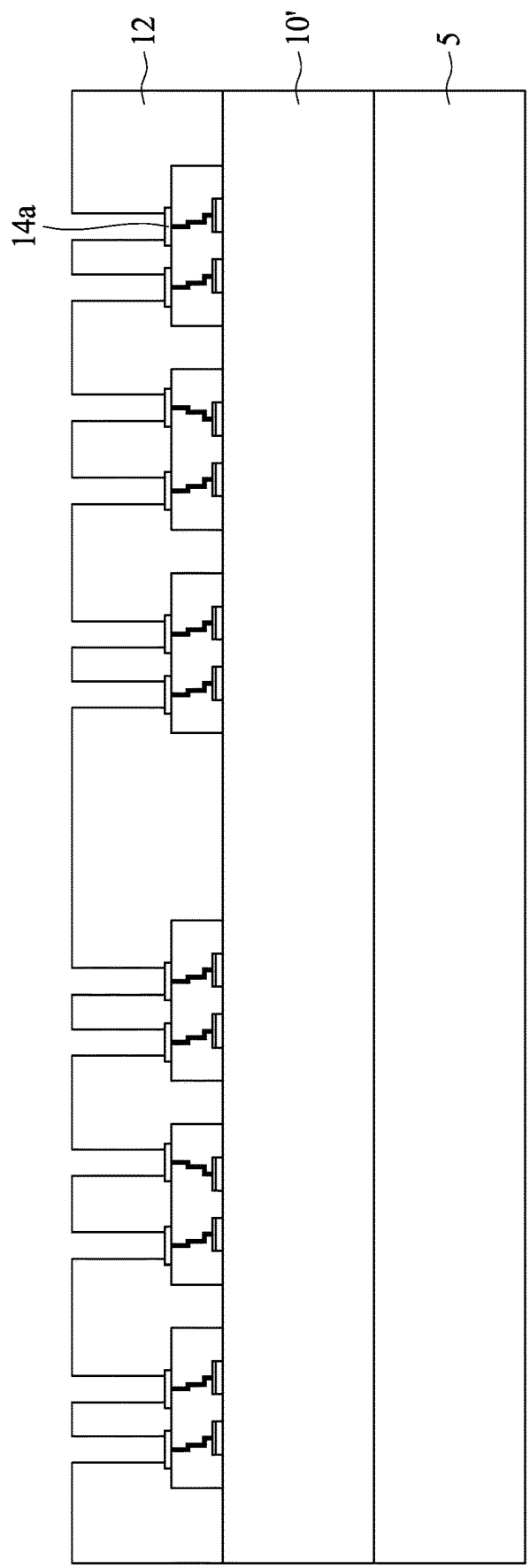
Figure 3H:
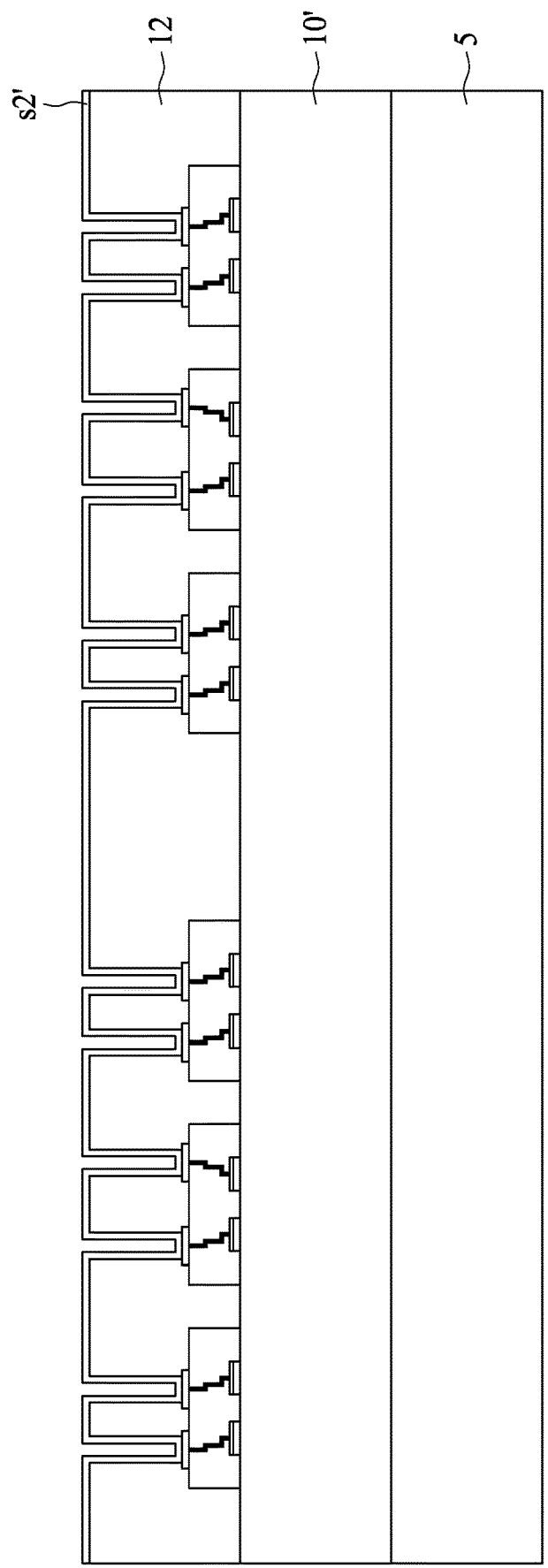
Figure 3I:
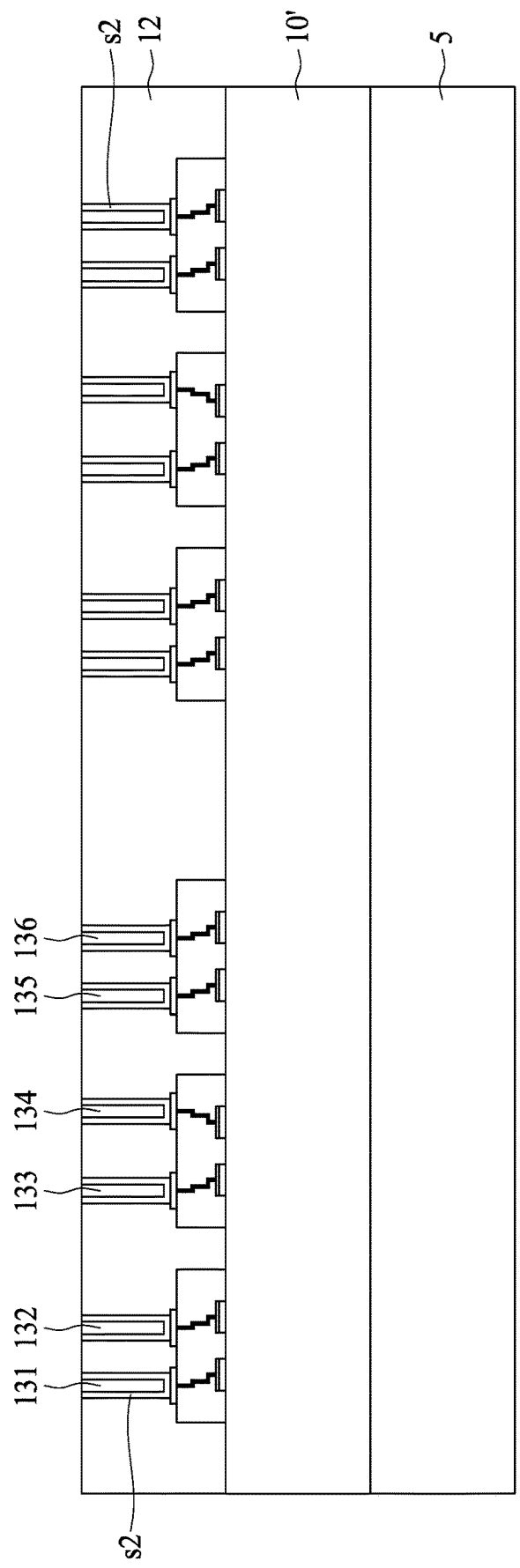
Figure 3J:
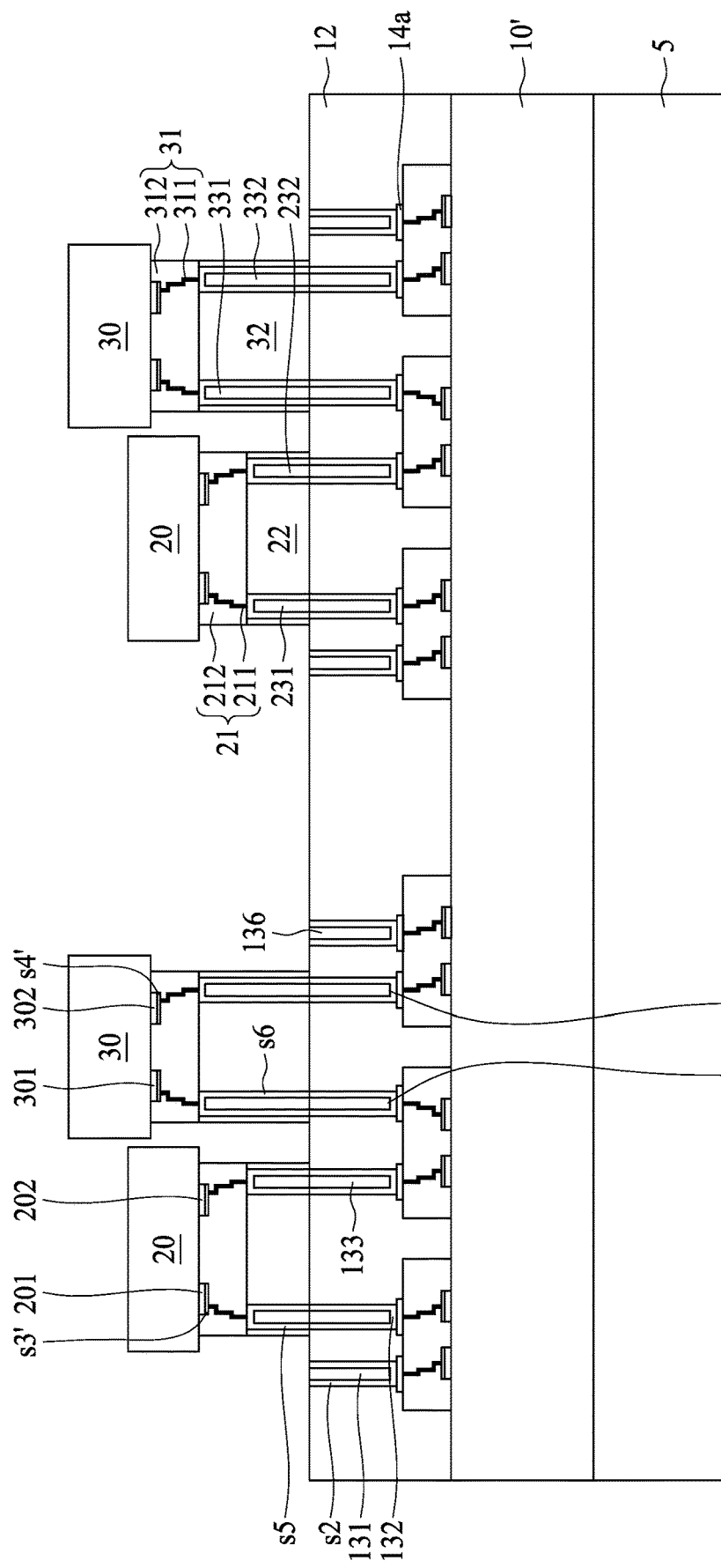

Referring to FIG. 3E, some anti-oxidation structures 14*a* can be formed on the RDL structures 11*a*, 11*b* and 11*c*. The anti-oxidation structure 14*a* can be electrically connected to the redistribution circuitry 111. The anti-oxidation structure 14a can be electrically connected to the redistribution circuitry 113. The anti-oxidation structure 14a can be electrically connected to the redistribution circuitry 115.

The anti-oxidation structure 14a can be formed by, for example but is not limited to, deposition (e.g. electroless deposition), plating (e.g. electroless plating) or other suitable technique(s). The anti-oxidation structure 14a can include, for example but is not limited to, nickel (Ni), platinum (Pt), gold (Au), palladium (Pd) or other suitable material(s). The anti-oxidation structure 14a can include conductive material(s). The anti-oxidation structure 14a can include material(s) which can be resistant to corrosion or oxidation. The anti-oxidation structure 14a can include anti-oxidation material(s).

The operations shown in FIG. 3F, FIG. 3G, FIG. 3H, FIG. 3I, FIG. 3J, FIG. 3K, FIG. 3L, FIG. 3M and FIG. 3N can be same or similar to the operations as discussed above with respect to FIG. 1E, FIG. 1F, FIG. 1G, FIG. 1H, FIG. 1I, FIG. 1J, FIG. 1K, FIG. 1L, FIG. 1M and FIG. 1N.

Figure 4:
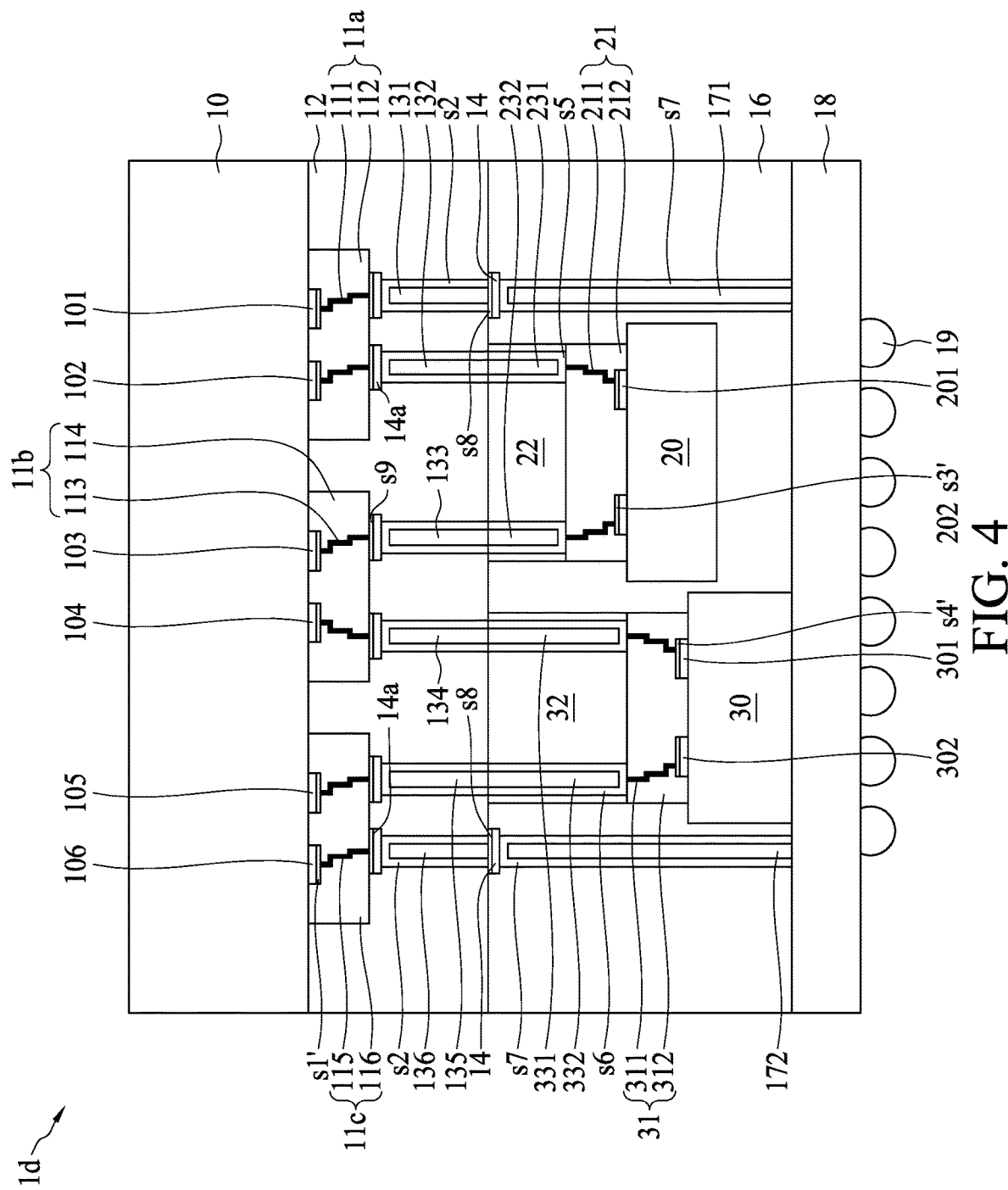
FIG. 4 is a cross-sectional view of another semiconductor device package in accordance with some embodiments of the present disclosure.

FIG. 4 is a cross-sectional view of another semiconductor device package in accordance with some embodiments of the present disclosure.

Referring to FIG. 4, the semiconductor device package 1d is similar to the semiconductor device package 1c as illustrated and described with reference to FIG. 3, except that a conductive layer s8 is disposed between the anti-oxidation structure 14 and the insulation layer 12, and a conductive layer s9 is disposed between the anti-oxidation structure 14a and each of the RDL structures 11a, 11b, and 11c.

The conductive layer s8 can include a single-layer structure. The conductive layer s8 can include a multi-layer structure. The conductive layer s8 can function as a seed layer during manufacture of the semiconductor device package 1d (e.g. during electroplating operation). The conductive layer s8 can include, for example but is not limited to, titanium (Ti), copper (Cu), TiCu, or other conductive material(s).

The conductive layer s8 can have a width substantially the same to the anti-oxidation structure 14. The conductive layer s8 can be in direct contact with the anti-oxidation structure 14. The conductive layer s8 can be in direct contact with the insulation layer 12. The conductive layer s8 can be in direct contact with the conductive layer s2. The conductive layer s8 can be in direct contact with the conductive pillar 131. The conductive layer s8 can be in direct contact with the conductive pillar 136.

The conductive layer s8 can be disposed between the anti-oxidation structure 14 and the conductive layer s2. The conductive layer s8 can be disposed between the anti-oxidation structure 14 and the conductive pillar 131. The conductive layer s8 can be disposed between the anti-oxidation structure 14 and the conductive pillar 136.

The conductive layer s9 can have a structure same or similar to the conductive layer s8. The conductive layer s9 can have a structure different from the conductive layer s8.

The conductive layer s9 can have a width substantially the same to the anti-oxidation structure 14a. The conductive layer s9 can be in direct contact with the anti-oxidation structure 14a. The conductive layer s9 can be in direct contact with the insulation layer 112. The conductive layer s9 can be in direct contact with the insulation layer 114. The conductive layer s9 can be in direct contact with the insulation layer 116. The conductive layer s9 can be in direct contact with the redistribution circuitry 111. The conductive layer s9 can be in direct contact with the redistribution circuitry 113. The conductive layer s9 can be in direct contact with the redistribution circuitry 115.

The conductive layer s9 can be in direct contact with the conductive layer s2.

Figure 3K:
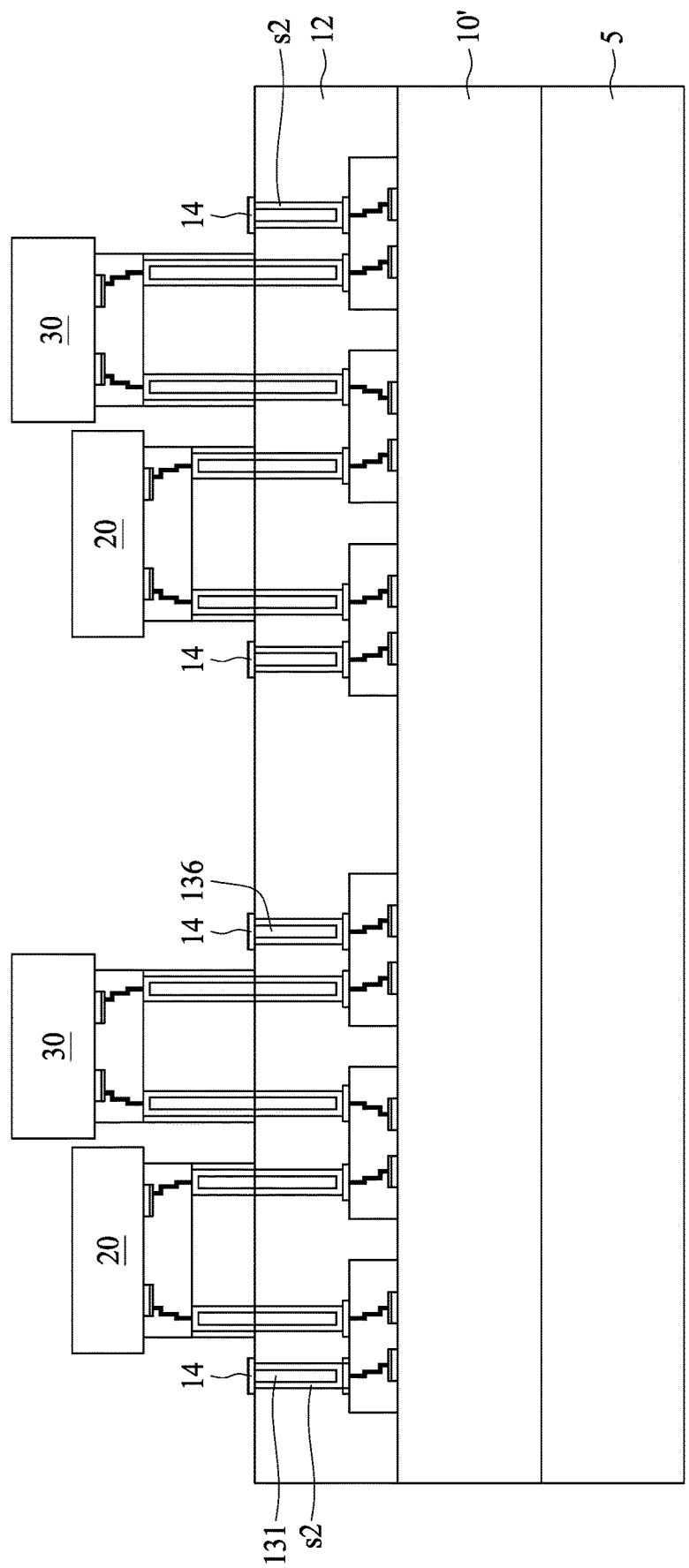
Figure 3L:
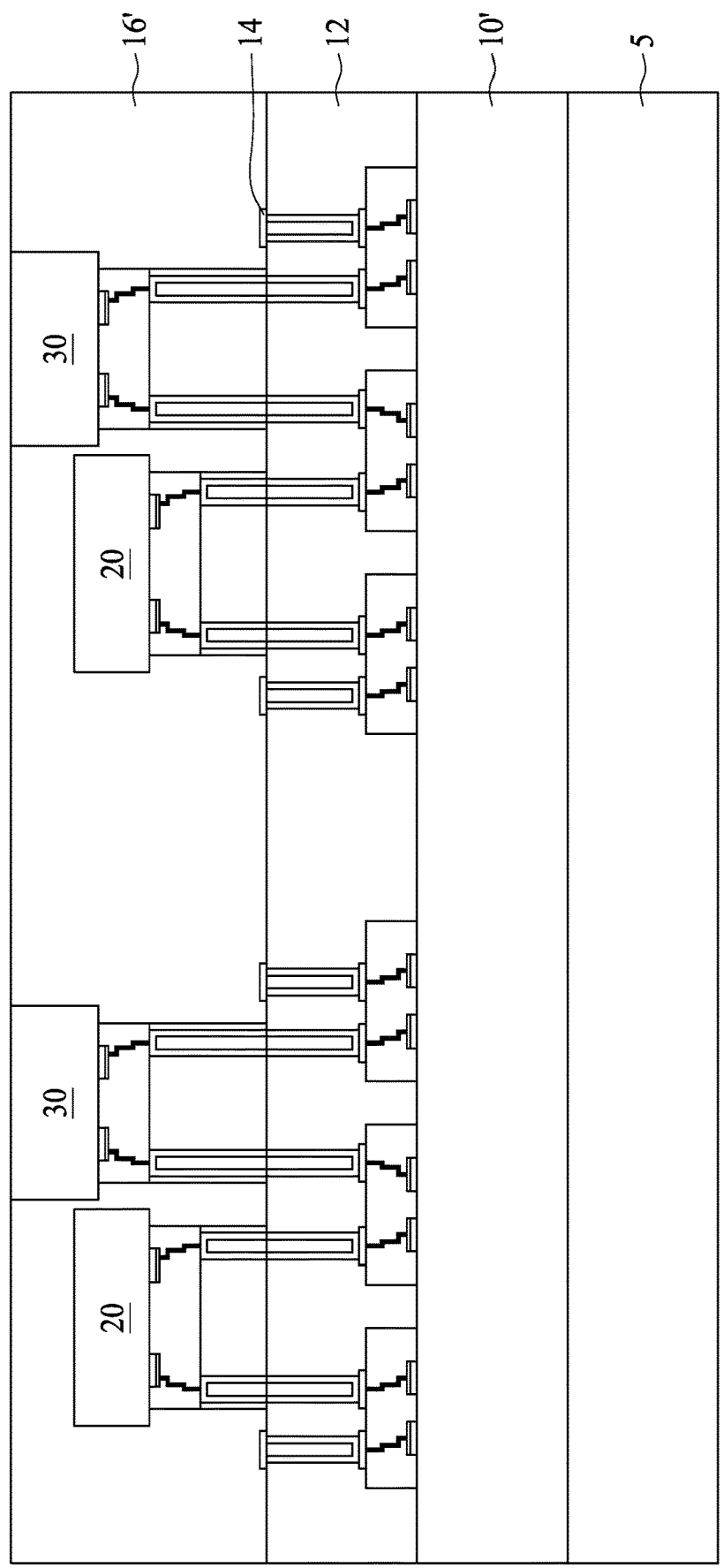
Figure 3M:
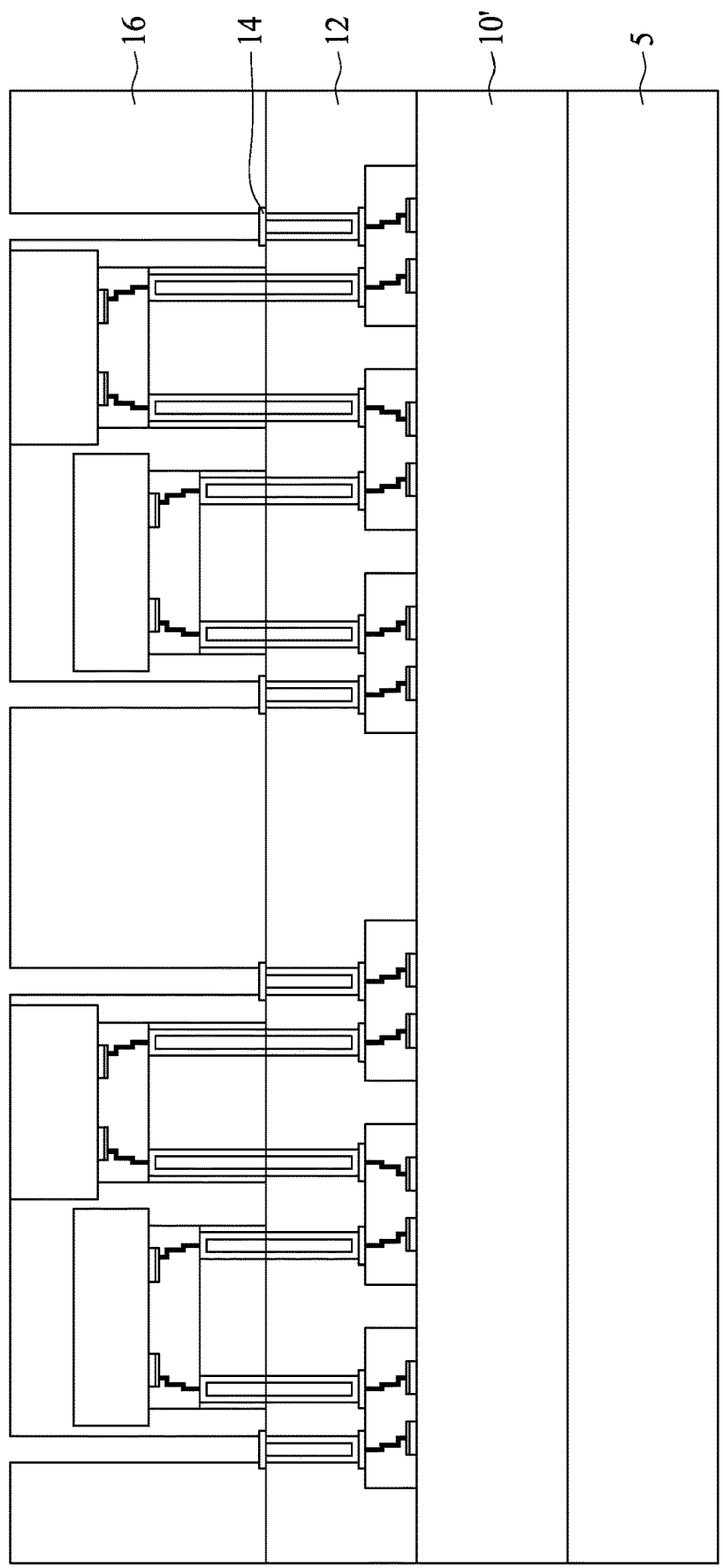
Figure 3N:
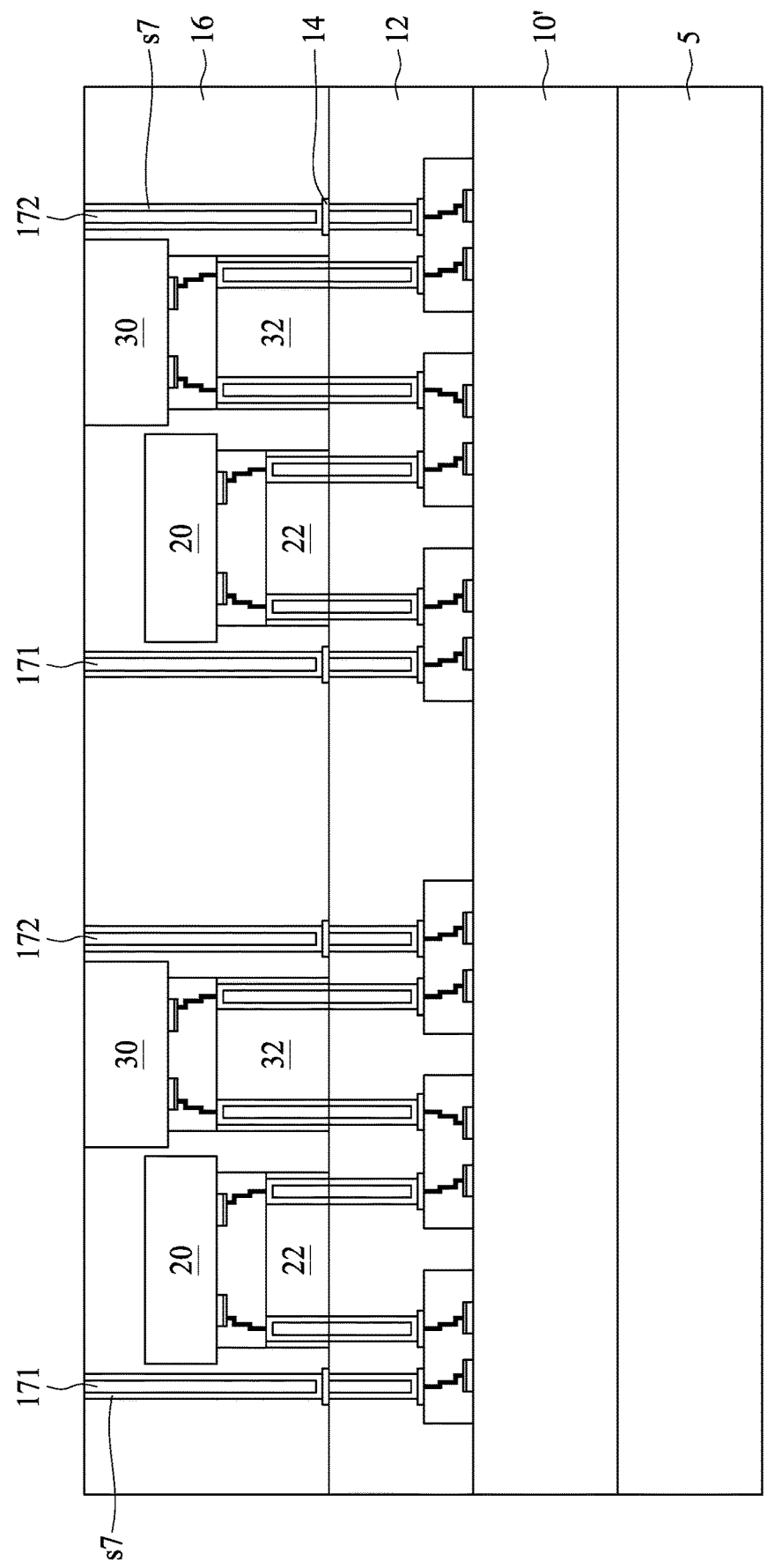

Method for manufacturing the semiconductor device package 1d can be similar to the operations as illustrated and described with reference to FIG. 3A, FIG. 3B, FIG. 3C, FIG. 3D, FIG. 3E, FIG. 3F, FIG. 3G, FIG. 3H, FIG. 3I, FIG. 3J, FIG. 3K, FIG. 3L, FIG. 3M and FIG. 3N, except that the conductive layers s9 and s8 can be formed in the operation as shown in FIG. 3E and FIG. 3K prior to forming the anti-oxidation structure 14. The conductive layers s8 and s9 can be formed by, for example but is not limited to, sputtering, deposition (e.g. physical vapor deposition (PVD)) or other suitable technique(s). The conductive layers s8 and s9 can be formed by, for example but is not limited to, etching or other suitable technique(s). The conductive layers s8 and s9 can facilitate forming the anti-oxidation structures 14 and 14a if electroplating technique is used.

Figure 5A:
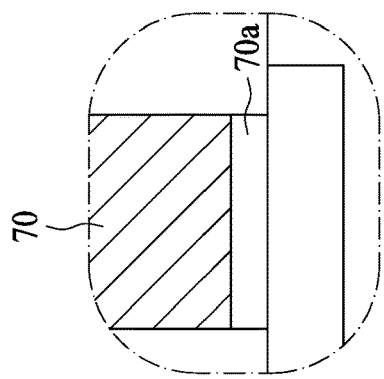
FIG. 5A is an enlarged view of the structure in the dotted-box A as shown in FIG. 5.
Figure 5B:
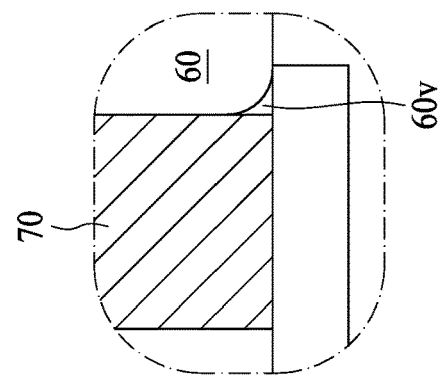
FIG. 5B is an enlarged view of the structure in the dotted-box A as shown in FIG. 5.
Figure 5:
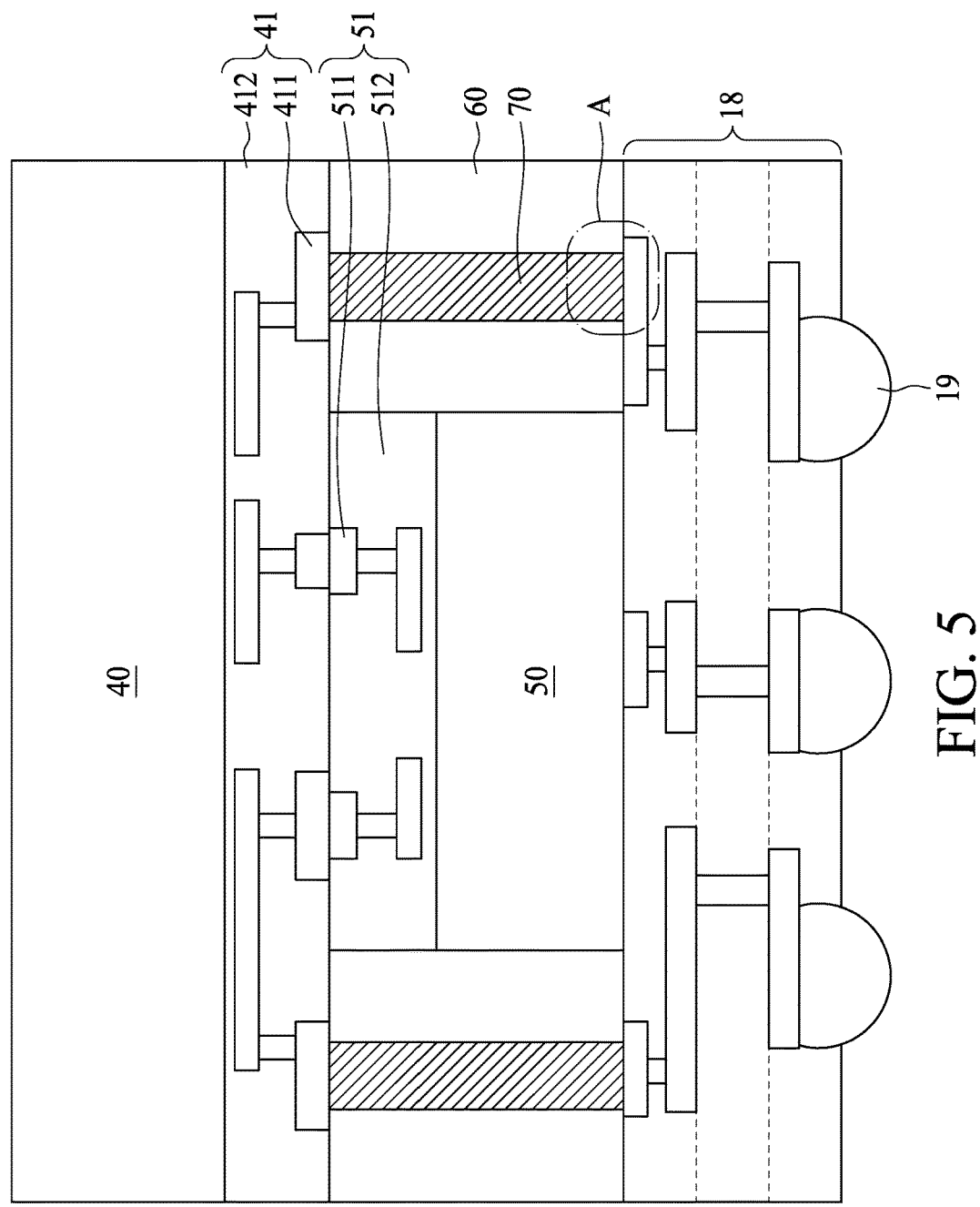
FIG. 5 is a cross-sectional view of another semiconductor device package in accordance with some embodiments of the present disclosure.

FIG. 5 is a cross-sectional view of another semiconductor device package in accordance with some embodiments of the present disclosure.

Referring to FIG. 5, a semiconductor device package 1e can include a semiconductor device 40, a semiconductor device 50, an encapsulant 60, interconnections 60, RDL structures 41, 51 and 18, and connection elements 19.

The semiconductor device 40 is electrically connected to the RDL structure 41, which includes a redistribution circuitry 411 and an insulation layer 412.

The semiconductor device 50 is electrically connected to the RDL structure 51, which includes a redistribution circuitry 511 and an insulation layer 512. The redistribution circuitry 511 is electrically connected to the redistribution circuitry 411. The redistribution circuitry 511 can be electrically connected to the redistribution circuitry 411.

The interconnection 60 can include connective pillar, via or post. The interconnection 60 is disposed in the encapsulant 70. The encapsulant 70 encapsulates the interconnection 60. The interconnection 60 can be electrically connected to the RDL structure 18. The connection elements 19 can be electrically connected to the RDL structure 18.

Data or signal transmission between the semiconductor device 40 and the semiconductor device 50 can be performed on a conductive path including the redistribution circuitry 411 and the redistribution circuitry 511.

Input/output (I/O) data or signal transmission of the semiconductor device package 1e can be performed on a conductive path including the redistribution circuitry 411, the interconnection 60, the RDL structure 18 and the connection elements 19.

FIG. 5A is an enlarged view of the structure in the dotted-box A as shown in FIG. 5.

Referring to FIG. 5A, part of the interconnection 60 can be oxidized or oxidated to form an oxidation layer 70a during manufacture of the semiconductor device package 1e. Thickness of the oxidation layer 70a can depend on time and temperature the interconnection 60 being exposed to the air (or oxygen). A relatively thick oxidation layer 70a can result in relatively great contact resistance (or resistance of contact). The relatively great contact resistance may adversely affect performance of the semiconductor device package 1e. For example, referring back to FIG. 5, the thick oxidation layer 70a, which has relatively great contact resistance, may slow down data transmission speed on the conductive path including the interconnection 60.

FIG. 5B is an enlarged view of the structure in the dotted-box A as shown in FIG. 5.

Referring to FIG. 5B, the oxidation layer 70a as shown in FIG. 5A can be eliminated during manufacture of the semiconductor device package 1e. A cleaning operation, for example but is not limited to a wet etching technique, can be performed to remove the oxidation layer. However, in order to remove most or the entire oxidation layer, the cleaning operation may last for a relatively great period of time, which may inevitably damage the insulation material or dielectric material (e.g. the encapsulant 60) to form an undercut 60v or a void 60v. The void 60v may adversely affect performance of the semiconductor device package 1e.

As used herein, spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately", "substantially", "substantial" and "about" are used to describe and account for small variations. When used in conduction with an event or circumstance, the terms can refer to instances in which the event of circumstance occurs precisely as well as instances in which the event or circumstance occurs to a close approximation. As sued herein with respect to to given value or range, the term "about" generally means within ±10%, ±5%, ±1%, or ±0.5% of the given value or range. Ranges can be expressed herein as from one endpoint to another endpoint or between two endpoints. All ranges disclosed herein are inclusive of the endpoints, unless specified otherwise. The term "substantially coplanar" can refer to two surfaces within micrometers (μm) of lying along a same plane, such as within 10 μm, within 5 μm, within 1 μm, or within 0.5 μm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A semiconductor device package, comprising:
   a first semiconductor device having a first conductive terminal and a second conductive terminal;
   a first redistribution layer (RDL) structure covering the first conductive terminal;
   a second RDL structure covering the second conductive terminal and separated from the first RDL structure;
   a first interconnection structure electrically connected to the first RDL structure;
   a second interconnection structure electrically connected to the first interconnection structure; and
   a first anti-oxidation structure disposed between the first interconnection structure and the second interconnection structure.

2. The semiconductor device package of claim 1, further comprising a first conductive layer covering a first surface of the first conductive terminal.

3. The semiconductor device package of claim 2, wherein the first conductive layer covers a second surface of the first conductive terminal, and wherein the second surface of the first conductive terminal is different from the first surface and lateral to the first surface.

4. The semiconductor device package of claim 1, wherein the first anti-oxidation structure has a first width and the first interconnection structure has a second width, and wherein the first width is equal to or greater than the second width.

5. The semiconductor device package of claim 1, wherein the first anti-oxidation structure has a first width and the second interconnection structure has a second width, and wherein the first width is equal to or greater than the second width.

6. The semiconductor device package of claim 1, wherein the first anti-oxidation structure is in direct contact with the first interconnection structure.

7. The semiconductor device package of claim 1, wherein the first anti-oxidation structure is in direct contact with the second interconnection structure.

8. The semiconductor device package of claim 1, further comprising a connection element for external connection, wherein the connection element is electrically connected to the second interconnection structure.

9. The semiconductor device package of claim 1, further comprising a first conductive layer disposed between the first interconnection structure and the first anti-oxidation structure.

10. The semiconductor device package of claim 1, further comprising a second semiconductor device having a first conductive terminal electrically connected to the first RDL structure and a second conductive terminal electrically connected to the second RDL structure.

11. A semiconductor device package, comprising:
    a first RDL structure having a first surface and a second surface opposite the first surface;
    a first semiconductor device disposed on the first surface of the first RDL structure;
    a second semiconductor device disposed on the first surface of the first RDL structure and adjacent to the first semiconductor device;
    a third semiconductor device disposed on the first semiconductor device and the second semiconductor device, and electrically connected to the first semiconductor device and the second semiconductor device;
    a first interconnection structure disposed adjacent to a side of the first semiconductor device; and
    a first anti-oxidation structure disposed on the first interconnection structure.

12. The semiconductor device package of claim 11, wherein the first anti-oxidation structure has a first width and the first interconnection structure has a second width, and wherein the first width is equal to or greater than the second width.

13. The semiconductor device package of claim 11, further comprising a connection element disposed on the second surface of the first RDL structure for external connection.

14. The semiconductor device package of claim 11, wherein the first anti-oxidation structure is in direct contact with the first interconnection structure.

15. The semiconductor device package of claim 11, further comprising a second interconnection structure disposed on the first anti-oxidation structure and electrically connected to the third semiconductor device.

16. The semiconductor device package of claim 11, wherein the third semiconductor device is electrically connected to the first semiconductor device via a second RDL structure, and is electrically connected to the second semiconductor device via a third RDL structure, and wherein the second RDL structure is separated from the third RDL structure.

* * * * *